US010322879B2

(12) United States Patent
Jacobsson et al.

(10) Patent No.: US 10,322,879 B2
(45) Date of Patent: Jun. 18, 2019

(54) METHOD, SYSTEM AND DEVICE FOR IDENTIFYING A BIN IN AN SMT SYSTEM

(71) Applicant: Mycronic AB, Taby (SE)

(72) Inventors: Nils Jacobsson, Taby (SE); Roger Jonasson, Taby (SE)

(73) Assignee: Mycronic AB, Taby (SE)

( * ) Notice: Subject to any disclaimer, the term of this patent is extended or adjusted under 35 U.S.C. 154(b) by 498 days.

(21) Appl. No.: 15/022,831

(22) PCT Filed: Sep. 17, 2014

(86) PCT No.: PCT/EP2014/069837
§ 371 (c)(1),
(2) Date: Mar. 17, 2016

(87) PCT Pub. No.: WO2015/040085
PCT Pub. Date: Mar. 26, 2015

(65) Prior Publication Data
US 2016/0234986 A1  Aug. 11, 2016

Related U.S. Application Data

(60) Provisional application No. 61/879,172, filed on Sep. 18, 2013.

(51) Int. Cl.
*G06F 7/00* (2006.01)
*B65G 1/137* (2006.01)
(Continued)

(52) U.S. Cl.
CPC .......... *B65G 1/137* (2013.01); *B65G 1/1371* (2013.01); *G05B 19/41865* (2013.01); *H05K 13/021* (2013.01); *H05K 13/0404* (2013.01); *H05K 13/0417* (2013.01); *H05K 13/0419* (2018.08); *H05K 13/0434* (2013.01); *H05K 13/08* (2013.01); *H05K 13/086* (2018.08);
(Continued)

(58) Field of Classification Search
None
See application file for complete search history.

(56) References Cited

U.S. PATENT DOCUMENTS 4,651,863 A    3/1987  Reuter et al.
5,321,885 A    6/1994  Hino et al.
(Continued)

FOREIGN PATENT DOCUMENTS

CN    101444152 A    5/2009
CN    1013313588 A    9/2013
(Continued)

OTHER PUBLICATIONS

U.S. Appl. No. 15/022,799, filed Mar. 17, 2016.
(Continued)

*Primary Examiner* — Yolanda R Cumbess
(74) *Attorney, Agent, or Firm* — Harness, Dickey & Pierce, P.L.C.

(57) ABSTRACT

A method in an automated Surface Mount Device (SMD) warehouse configured to store bins at predetermined positions within said automated Surface Mount Device (SMD) warehouse, the method comprising receiving a bin at a port of said automated Surface Mount Device (SMD) warehouse and scanning an identity tag attached to said bin to obtain a bin ID.

16 Claims, 21 Drawing Sheets

(51) Int. Cl.
  *G05B 19/418* (2006.01)
  *H05K 13/04* (2006.01)
  *H05K 13/02* (2006.01)
  *H05K 13/08* (2006.01)

(52) U.S. Cl.
  CPC .............. *G05B 2219/34349* (2013.01); *G05B 2219/45026* (2013.01)

(56) References Cited

U.S. PATENT DOCUMENTS

| | | | |
|---|---|---|---|
| 5,429,470 | A | 7/1995 | Nicol et al. |
| 5,456,001 | A | 10/1995 | Mori et al. |
| 6,272,743 | B1 | 8/2001 | Nishimori et al. |
| 6,572,702 | B1 | 6/2003 | Freeman et al. |
| 6,631,870 | B2 | 10/2003 | Bergstrom |
| 6,817,527 | B2 | 11/2004 | Hellberg et al. |
| 6,869,040 | B2 | 3/2005 | Eskang |
| 7,651,310 | B2 | 1/2010 | Gambarelli et al. |
| 9,095,086 | B2 | 7/2015 | Peng et al. |
| 2011/0203106 | A1* | 8/2011 | Tanaka ............... H05K 13/0452 29/720 |
| 2014/0222191 | A1 | 8/2014 | Blumenau |
| 2017/0027091 | A1* | 1/2017 | Jakobsson .......... H05K 13/0417 |
| 2018/0130011 | A1* | 5/2018 | Jacobsson ............ G06Q 10/087 |

FOREIGN PATENT DOCUMENTS

| | | | |
|---|---|---|---|
| DE | 102006022371 A1 * | 11/2007 | .......... H05K 13/086 |
| EP | 1147697 A1 | 10/2001 | |
| EP | 1381265 A1 | 1/2004 | |
| JP | 2005-503032 A | 1/2005 | |
| JP | 2012-134331 A | 7/2012 | |
| KR | 20120139263 A | 12/2012 | |
| KR | 101229981 B1 | 2/2013 | |
| WO | WO-03024181 A1 | 3/2003 | |

OTHER PUBLICATIONS

International Search Report PCT/ISA/210 for International Application No. PCT/EP2014/069831 dated Feb. 20, 2015.
U.S. Office Action dated Nov. 22, 2016 for U.S. Appl. No. 15/022,799.
U.S. Office Action dated Jun. 20, 2017 in U.S. Appl. No. 15/022,799.
International Search Report PCT/ISA/210 for International Application No. PCT/EP2014/069837 dated Feb. 20, 2015.
Japanese Office Action dated Sep. 25, 2018 issued in corresponding Japanese Application No. 2016-543390 (with English Translation).
Chinese Office Action dated Jun. 29, 2018 in Chinese Application No. 201480061649.2, and English translation.
Office Action dated Sep. 5, 2018 in related U.S. Appl. No. 16/026,570.

* cited by examiner

METHOD, SYSTEM AND DEVICE FOR IDENTIFYING A BIN IN AN SMT SYSTEM

CROSS-REFERENCE TO RELATED APPLICATIONS

This application is a National Stage Application of PCT/EP2014/069837 filed on Sep. 17, 2014, which claims benefit of U.S. Provisional Application No. 61/879,172 filed on Sep. 18, 2013 the entire contents of each of which are hereby incorporated by reference.

TECHNICAL FIELD

The present invention relates to handling of components in an SMT system, in particular identifying a bin in an automated storage unit.

BACKGROUND

Surface Mount Technology is the preferred method of automated production of electronic printed circuit boards. Machines for pick-and-place mounting of electronic components on a substrate, such as a Printed Circuit Board (PCB), or a substrate for a System in Package (SiP) component are subject to different, often contradictory demands, such as mounting speed, mounting precision, size, prize, etc. The expression "pick and place" is understood by the person skilled in the art as describing the very mounting operation where a mounting head is moved to a component feeder area, where the mounting head picks one or more electronic components from one or more pick-up positions of component feeders or tape guides, and then is moved to a mounting area where the mounting head places the component or components on the substrate.

Supplies of a certain type of component, e.g. a certain specified type of capacitor, resistor, diode or IC are supplied on trays carrying one type of component or on sticks or, as has become most common today, on tapes in reels with a series of pockets of appropriate depth in the tape, holding one component in each pocket. The reels have varying widths between 8 mm and 44 mm. A row of component tape reels, each reel representing a certain type of component, are typically placed in a certain slot/position (among a pre-defined number of compartments or slots adapted to receive one reel each) in a trolley having a driving/feeding mechanism, or a certain compartment/slot/position in a non-motorized bin which in turn is placed in a magazine, or pick-and-place machine, having a driving/feeding mechanism such as a motor.

When preparing an upcoming SMT job, the component tape reels are typically pre-loaded into their respective component feeders, or tape guides, before they are placed in a motorized trolley, or non-motorized bin. The component feeders, or tape guides, may or may not therefore have their own built-in tape advancing/driving mechanism, e.g. a motor, and are adapted to guide and/or feed components of the component tape reels to their respective feeder positions, or pick-ip positions of the pick-and-place machine, as the mounting head of the pick-and-place machine rapidly picks components out of their pockets and place them on the board. Component manufacturers deliver the components in standard reels of pocket-tape with a thin cover tape closing the pockets. This pocket cover tape must be removed by some method before the component can be picked out of its pocket.

As mentioned above, the tape guides or feeders are used to feed and/or guide the component tape to the pick-and-place machine as the components are picked out of the pockets. One such tape guide or feeder is described in various patents by the applicant, e.g. EP 1 381 265 B1, incorporated herein by reference. This type of component tape guide or feeder has no built-in tape advancing mechanism. Rather, the tape guide or feeder is mounted for use in the pick-and-place machine so that a feeding mechanism, e.g. a feeding wheel in the tape magazine or pick-and-place machine protrudes through the tape guide or feeder into contact with the pre-threaded tape. Another type of component tape guide has a built-in tape advancing mechanism. The tape guide or feeder is mounted for use in the pick-and-place machine so that an in-feeder built-in feeding mechanism or tape advancing mechanism advances the tape, e.g. a feeding wheel in the feeder into contact with the pre-threaded tape.

In state of the art solutions provided by the applicant, each tape guide or feeder has a specific identity in relation to the pick-and-place machine and in whatever sequential position the reel with its pre-threaded tape guide or feeder is placed in the machine, and the mounting head of the pick-and-place machine will, based on the identity of the tape guide and the feeder position it is feeding components to the pick-and-place machine from, properly find and pick-up the proper components from the tape pockets. A method of associating the identity of the tape guide or feeder used to the specifics of the components in the tape threaded into the guide or feeder is described in various patents by the applicant, e.g. EP 1 147 697 B1, which is incorporated herein by reference.

Bins are in state of the art systems provided by the applicant used to house a row of reels in a magazine as the pick-and-place machine picks components out of the pockets of the pocket-tape. A bin has a predefined number of slots adapted to receive reels. One such bin is shown in WO03024181 A1, incorporated herein by reference.

Therefore, there is a need to improve handling of components in an SMT system, in particular for improving the efficiency of storage and retrieval of components in an automated Surface Mount Device (SMD) warehouse.

SUMMARY

The invention relates to improved handling of components in an SMT system.

The invention relates to a method, system and device for identifying a bin in an automated storage unit.

Another purpose of the present invention is to achieve a system and a method that identify a bin and allows retrieving bin load units in a bin during production of an SMT job.

The invention offers a solution by receiving a bin at a port of said automated Surface Mount Device (SMD) warehouse; scanning an identity tag attached to said bin to obtain a bin ID; storing said bin at a position within said automated Surface Mount Device (SMD) warehouse; and storing said position and said bin ID.

In one or more aspects of the technology disclosed, a method is provided in an automated Surface Mount Device (SMD) warehouse configured to store bins at predetermined positions within said automated Surface Mount Device (SMD) warehouse, the method comprising:

receiving a bin at a port of said automated Surface Mount Device (SMD) warehouse; and scanning an identity tag attached to said bin to obtain a bin ID.

In one or more aspects of the technology disclosed, the method is further comprising:
    storing said bin at a position within said automated Surface Mount Device (SMD) warehouse.
In one or more aspects of the technology disclosed, the method is further comprising:
    storing said position and said bin ID.
In one or more aspects of the technology disclosed, said storing is performed in a memory of said automated Surface Mount Device (SMD) warehouse.
In one or more aspects of the technology disclosed, said method is further comprising:
    presenting said retrieved bin at a port of said automated Surface Mount Device (SMD) warehouse.
In one or more aspects of the technology disclosed, said bins are adapted to comprise bin load units, wherein said bin load unit comprises at least a component tape reel.
In one or more aspects of the technology disclosed, said storing of said position and said bin ID further comprises storing said position and said bin ID represented as parameters in a memory of said automated Surface Mount Device (SMD) warehouse.
In one or more aspects of the technology disclosed, said storing of said position and said bin ID further comprises storing said position and said bin ID represented as parameters in an SMT information database via a communications network.
In one or more aspects of the technology disclosed, a method is provided in an automated Surface Mount Device (SMD) warehouse adapted to obtain information related to upcoming SMT jobs, to retrieve bins at predetermined positions within said automated Surface Mount Device (SMD) warehouse, the method comprising:
    retrieving said bin at a position within said automated Surface Mount Device (SMD) warehouse;
    scanning an identity tag attached to said bin to obtain a bin ID;
    presenting said retrieved bin at a port of said automated Surface Mount Device (SMD) warehouse; and
    storing said position and said bin ID.
In one or more aspects of the technology disclosed, said storing comprises storing in a memory of said automated Surface Mount Device (SMD) warehouse.
In one or more aspects of the technology disclosed, said bins are configured to comprise bin load units, wherein said bin load unit comprises or constitutes a component tape reel.
In one or more aspects of the technology disclosed, storing said position and said bin ID further comprises storing said position and said bin ID represented as parameters in a memory of said automated Surface Mount Device (SMD) warehouse.
In one or more aspects of the technology disclosed, storing said position and said bin ID further comprises storing said position and said bin ID represented as parameters in an SMT information database via a communications network.
In one or more aspects of the technology disclosed, said bin is configured to be loaded with a plurality of bin load units and is further adapted to be stored in an automated Surface Mount Device (SMD) warehouse system, said bin comprising:
    an identity tag attached to said bin in a predetermined position.
In one or more aspects of the technology disclosed, said predetermined position is chosen to enable a scanner or reader unit comprised in said Surface Mount Device (SMD) warehouse to automatically scan or read said identity tag.

In one or more aspects of the technology disclosed, an automated Surface Mount Device (SMD) warehouse is provided for storing or retrieving of bins comprising:
    an actuator, such as a robot or robotic arm, adapted to handle or help out in the scanning of an identity tag attached to a bin, to obtain a bin ID, retrieve or store bins at predetermined positions within the automated Surface Mount Device (SMD) warehouse based on control data received from a first processor,
    a memory; and
    a second processor, adapted to receive information about the scanning of an identity tag attached to said bin to obtain a bin ID, where said first and second processor may or may not be the same processor.
In one or more aspects of the technology disclosed, said processor in said automated Surface Mount Device (SMD) warehouse is further adapted to control the steps of:
    receiving a bin at a port of said automated Surface Mount Device (SMD) warehouse; and
    storing said bin at a position within said automated Surface Mount Device (SMD) warehouse; or to control the steps
    retrieving said bin at a position within said automated Surface Mount Device (SMD) warehouse; and;
    presenting said retrieved bin at a port of said automated Surface Mount Device (SMD) warehouse;
In one or more aspects of the technology disclosed, an automated Surface Mount Device (SMD) warehouse system is provided, comprising:
    an actuator, such as a robot or robotic arm, adapted to retrieve or store bins, pallets or component tape reels at predetermined positions within the automated Surface Mount Device (SMD) warehouse based on control data received from a processor,
    a memory
    a processor adapted to obtain information related to upcoming SMT jobs.
In one or more aspects of the technology disclosed, a computer program product is provided, said computer program product comprising computer readable code configured to, when executed in a processor, perform any or all of the methods steps described herein.
In one or more aspects of the technology disclosed, a non-transitory computer readable memory is provided on which computer readable code is stored and which is configured to, when executed in a processor, perform any or all of the methods steps described herein.
In one or more aspects of the technology disclosed, a computer program product comprising computer readable code configured to, when executed in a processor, perform any or all of the methods steps described herein.
In one or more aspects of the technology disclosed, a non-transitory computer readable memory on which is stored computer readable code configured to, when executed in a processor, perform any or all of the methods steps described herein.

BRIEF DESCRIPTION OF DRAWINGS

These and other aspects of the invention will be described in the following description of the invention, given merely as one non-restricting example, with reference to the attached drawings, of which.

DETAILED DESCRIPTION

Background

Figure 1:
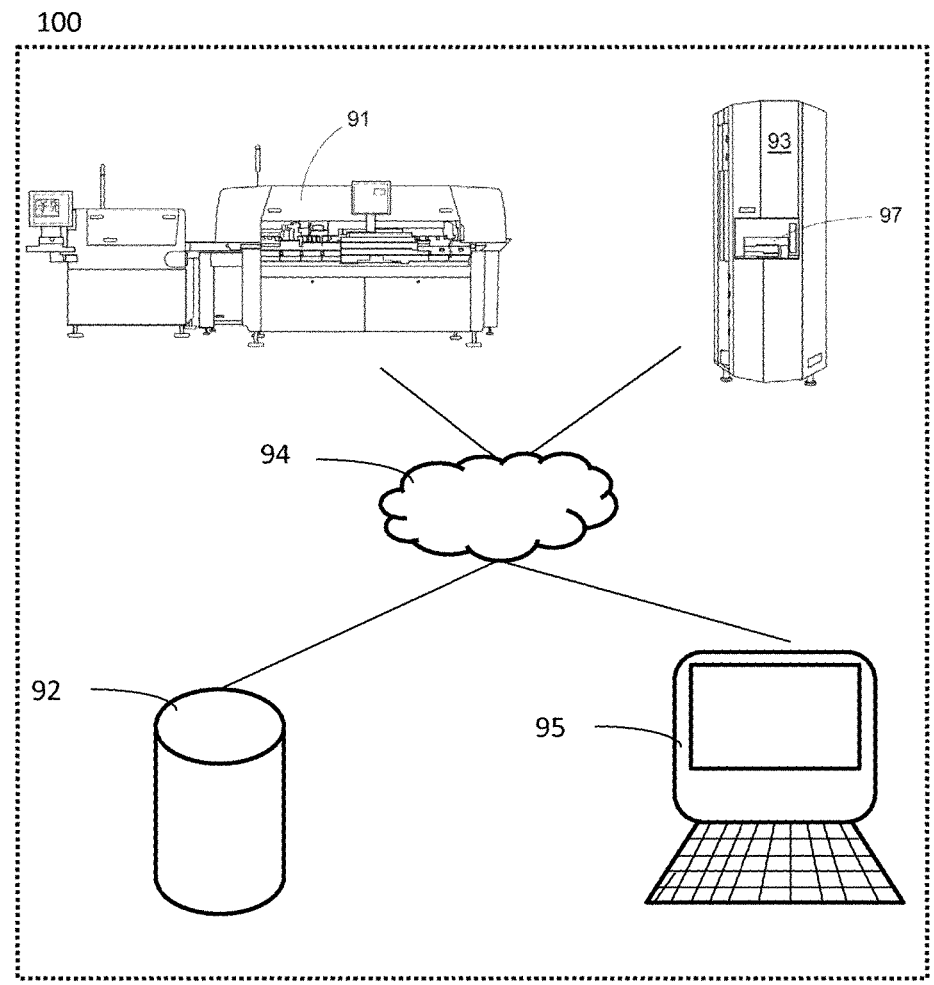
FIG. 1 shows schematically a system for SMT (Surface Mount Technology) semi-automated mounting of electronic components on printed circuit boards.

The invention relates to Surface Mount Technology (SMT) systems and SMT methods in the field of Surface Mount Technology are now the preferred method of automated production of electronic printed circuit boards. Such a system may typically comprise an SMT information database, an SMT pick and place machine, an automated Surface Mount Device (SMD) warehouse and optionally an SMT job planning computing device, wherein all the nodes mentioned above are communicatively coupled, e.g. in a communications network.

SMT pick and place machines for pick-and-place mounting of components on a substrate, such as a Printed Circuit Board (PCB), or a substrate for a System in Package (SiP) component are subject to different, often contradictory demands, such as mounting speed, mounting precision, size, prize, etc. The expression "pick and place" is understood by the person skilled in the art as describing the very mounting operation where a mounting head in said SMT pick and place machine is moved to a component feeder area, where the mounting head picks one or more components from one or more of the component feeders located at predetermined component feeder positions at the pick and place machine, and then is moved to a mounting area where the mounting head places the component or components on the substrate. The total task of placing all required components to a predetermined number of substrates is referred to as producing an SMT job. The SMT job typically comprises SMT job data descriptive of all required components, the position of each component on a substrate required to produce SMT production units, such as electronic printed circuit boards, and the planned relative order the SMT job should be produced in, e.g. third in order to be produced out of five planned SMT jobs.

A typical workflow in a SMT system, as the one described above, is that a planning user plans an SMT job to be executed, stores said SMT job in an SMT information database, an SMT operator, i.e. a human being or alternatively a robot, retrieves required components from said automated Surface Mount Device (SMD) warehouse and substrates from separate storage or from said automated Surface Mount Device (SMD) warehouse, transfers required components, e.g. placed on component tape reels, to the pick and place machine and loads predetermined component feeder positions at the pick and place machine, e.g. magazines or trolleys, of said SMT pick and place machine and start SMT production of SMT production units, i.e. substrates with SMT components placed thereupon.

The loading of predetermined component feeder positions at the pick and place machine, e.g. magazines, in said SMT pick and place machine with individual component tape reels may be time consuming and introduces risks of erroneous loading of the magazines.

The methods and systems disclosed describes an automated accumulator device, or automated Surface Mount Device (SMD) warehouse or storage unit, which is adapted to, based on input data received from an operator, retrieved or received from said SMT information database, receive bins, at an input port and automatically store bins in the automated SMD warehouse as well as to retrieve stored bins and present them at an output port. The bins may comprise or are pre-loaded with bin load units in compartments or slots of the bin. The bin load units comprise at least a component tape reel loaded with component tape. The automated Surface Mount Device (SMD) warehouse or storage unit is further adapted to, during idle periods when the automated Surface Mount Device (SMD) warehouse is not occupied with storing or retrieving bins, automatically redistribute bin loading units within a bin or between two or more stored bins. The automated Surface Mount Device (SMD) warehouse might further be adapted to automatically redistribute bins between storage positions within said automated Surface Mount Device (SMD) warehouse. The automatic redistribution may be performed according to certain conditions applied to input data received from an operator or retrieved from said SMT information database, such as component requirements of upcoming SMT jobs. The automatic redistribution may also be performed based on frequency of component use or maximum storage capacity.

The disclosed invention thereby solves the problem of reducing load time of the SMT pick and place machine, when transferring components from the automated Surface Mount Device (SMD) warehouse to the SMT pick and place machine as well as reducing storage time when returning components from the SMT pick and place machine to the automated Surface Mount Device (SMD) warehouse. A further advantage of the invention is to reduce the risk of erroneous loading of the SMT pick and place machine as a preconfigured bin comprising components, adapted to the upcoming SMT job, is placed in the SMT pick and place machine magazine without Definitions or Clarifications Surface-mount technology (SMT) is in this document to be understood as technology for assembling and mounting SMT production units, e.g. by placing SMT components on a substrate, such as a Printed Circuit Board (PCB), or a substrate for a System in Package (SiP).

SMT production is in this document to be understood as producing or assembling SMT production units, e.g. by placing SMT components contained in bin load units on a substrate, where in started SMT production involves at least feeding components from bin load units, such as component tape reels, to an SMT pick and place machine.

SMT system in this document may typically comprise an SMT information database, an SMT pick and place machine, an automated Surface Mount Device (SMD) warehouse and optionally an SMT job planning computing device, further detailed in FIG. 1, wherein all the nodes mentioned above are communicatively coupled, e.g. in a wired or wireless communications network. The communication method may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX), optical communication, infrared communication and ultrasonic communication, etc., but is not limited thereto.

SMT components or Surface-mount devices (SMD) is in this document to be understood as units to be placed on a substrate by the SMT system, in particular components adapted to be assembled or mounted by a SMT system. This may comprise electronic components or any other component used by the SMT system to produce an SMT production unit. The SMT components are usually delivered to a SMT pick and place machine in either paper/plastic/metallic pocket-tape, with a thin cover tape closing the pockets, wound on reels, in plastic tubes or in static-free trays whereby the SMT pick and place machine places the SMT components on said substrate to produce an SMT production unit. Non-limiting examples of SMT components are capacitors, resistors, diodes or integrated circuits (IC).

SMT component placement systems or SMT pick-and-place machines is in this document to be understood as robotic machines which are used to place SMT components onto a substrate. The SMT components, carried by tapes wound up on component tape reels, are placed in predetermined component feeding positions, e.g. magazines, in the pick and place machine. Pick and place machines are used for high speed, high precision placing of broad range of SMT components. An SMT feeder or Tape guide feeds or advances the component tape in the form of a pocket tape from the component tape reel and removes a thin cover tape closing the pockets. The feeder might utilize internal or external drive to feed the pocket tape. The pick and place machine actuators, e.g. robotic arms, adapted with nozzles rapidly pick components out of their pockets in the pocket tape and place them on the substrate. Information such as substrate positions and types of SMT components, previous to initiation of the assembly and mounting by the pick and place machine, is generated, planned or determined by a planning user on a SMT job planning computing device, together with the number of SMT production units to be produced, and stored as information in a SMT information database in the form of an SMT job. Multiple SMT jobs might be planned and ordered in a SMT job list, also referred to as upcoming SMT jobs, stored in said SMT information database.

SMT feeder or tape and reel feed mechanism is in this document to be understood as an arrangement through which the component tape is threaded. The SMT feeder is attached to or mounted on the pick and place machine and is adapted to feed or advance the pocket tape from the component tape reel and to remove a thin cover tape closing the pockets. The SMT feeder may have a built-in tape advancing mechanism or utilize a tape advancing mechanism of the pick and place machine or the magazine, e.g. a feeding wheel or a protrusion utilizing an internal or external drive such as a linear motor, in the pick-and-place machine or magazine protrudes through the tape guide into contact with the pre-threaded tape. The SMT feeder might adapted to comprise an SMT feeder ID that might be stored an associated to other identities in said SMT information database, e.g. associated to a component tape reel ID. The technology disclosed in this document also enables that the SMT feeder also may be adapted to comprise an SMT feeder ID that might be stored an associated to identities of other types of units such as bin IDs or pallet IDs of said SMT system, and where the bin IDs or pallet IDs also may be stored as IDs in an SMT information database.

SMT job planning computing device is in this document to be understood as a computing device comprising a processor, a memory, a user input/output interface and a communication interface adapted to receive user input as data, present data to said user, store data to memory, retrieve data from memory and send data to an external unit, e.g. the SMT information database. The SMT job planning computing device may be configured and used to plan and optimize one or a plurality of upcoming SMT jobs, e.g. the order of upcoming SMT jobs, the order of loading of SMT feeders into the pick and place machine etc.

SMT information database is in this document to be understood as a node adapted to receive information data via an external communication interface, such as a communication network, to store said data in memory, to receive a request for information, to retrieve data from memory based on said request and to send data via said external communication interface to a requesting node. Examples information stored in the database may be SMT component location on a substrate, type of SMT component, the number of produced substrates with placed SMT components, SMT job ID, identities of component tape reels, pallets and bins and association information, e.g. linking a component tape reel ID to a feeder ID, a component tape reel ID to a pallet ID or a component tape reel ID to a bin ID. The SMT information database might in aspect of the technology disclosed be implemented as a relational database, a dBASE database, an object oriented database, NewSQL database or NoSQL database such as an XML database.

Figure 2:
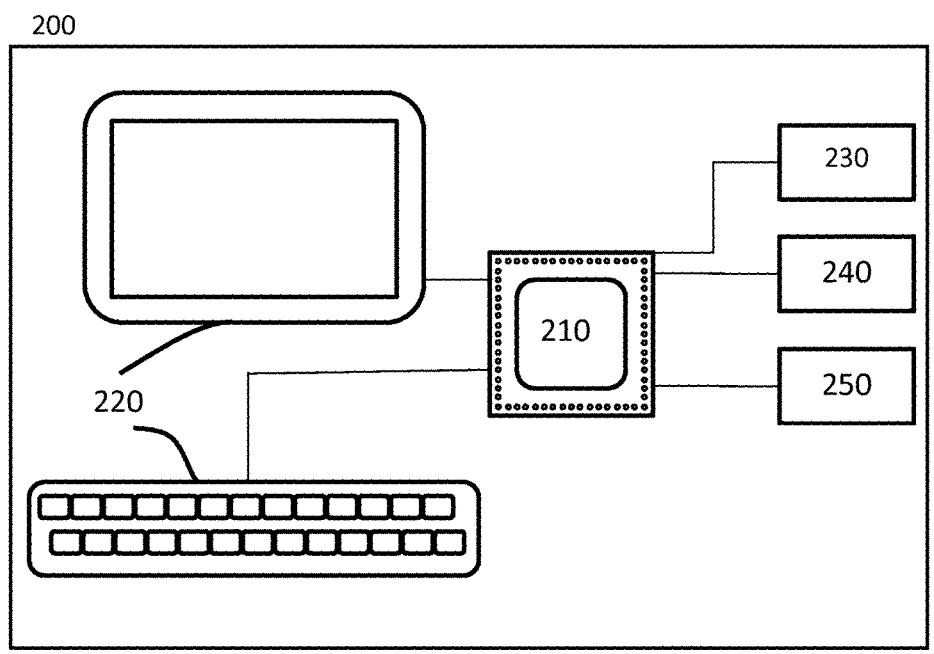
FIG. 2 shows an automated surface mount device (SMD) warehouse device.

Automated surface mount device (SMD) warehouse is in this document to be understood as an automatic robotic storage unit comprising a user input/output device 220, an external communication interface 240, a processor 210, and an actuator 250, further detailed in FIG. 2. The input/output device 220 is adapted to receive user indications as user indication data and to send the user indication data to a processor. The input/output device 220 is further adapted to receive user indication data from a processor and present the data to a user, e.g. by the use of indication means such as light emitting diodes or displays. The external communication interface 240 is adapted to receive data as a signal from a processor and to send said data as a signal to external units, such as the SMT information database. The external communication interface 240 is further adapted to receive data as a signal from external units, such as the SMT information database, and to send said data to said processor. The memory 230 is adapted to receive data as a signal from a processor and to store said data. The memory 230 is further adapted to retrieve data and to send said data as a signal to said processor. The processor 210 is adapted to receive input data, wherein said input data may be received from an operator or retrieved as information from the SMT information database, and to control the actuator 250.

In the technology disclosed, the actuator 250, e.g. a mechanical hand or robot arm, is adapted to be controlled by the processor to receive a bin at an input port of said automated Surface Mount Device (SMD) warehouse, to store said bin at a position within said automated Surface Mount Device (SMD) warehouse and to store said position and alternatively a bin ID, a pallet ID, a component tape reel ID or an SMT feeder ID in memory. The processor is further adapted to control the actuator to retrieve a bin at a position within said automated Surface Mount Device (SMD) warehouse, based on said input data and a position within said automated Surface Mount Device (SMD) warehouse retrieved from memory, and to present said retrieved bin at an output port of said automated Surface Mount Device (SMD) warehouse.

In the technology disclosed, the automated Surface Mount Device (SMD) warehouse or storage unit may further be configured to automatically redistribute bin loading units within a bin or between two or more stored bins, e.g. for replenishment purposes when the automated Surface Mount Device (SMD) warehouse concurrently is occupied with storing or retrieving bins or for optimization of upcoming SMT jobs or storage space in the Surface Mount Device (SMD) warehouse during idle periods when the automated Surface Mount Device (SMD) warehouse is not occupied with storing or retrieving bins. The automatic redistribution may be performed according to certain conditions applied to input data received from an operator or retrieved from said SMT information database, such as component requirements of upcoming SMT jobs. The automatic redistribution may also be performed based on frequency of component use or maximum storage capacity. As an example a bin or multiple bins might be loaded with component tape reels required for producing the next SMT job.

In the technology disclosed, a plurality of automated Surface Mount Device (SMD) warehouse may be configured to form an integrated automated Surface Mount Device (SMD) warehouse cluster, wherein bin load units may be redistributed between a first and a second automated Surface Mount Device (SMD) warehouse via a first opening in the first automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be passed or redistributed from said first Surface Mount Device (SMD) warehouse to said second Surface Mount Device (SMD) warehouse and vice versa. In one embodiment of the invention, said the integrated automated Surface Mount Device (SMD) warehouse cluster is the size of a warehouse.

In the technology disclosed, the automated Surface Mount Device (SMD) warehouse or storage unit may further be configured to store bins with a small physical volume, e.g. adapted to hold two bin load units as is further described in relation to FIG. 7.

In the technology disclosed, the automated Surface Mount Device (SMD) warehouse or storage unit may further be configured to store bins with a large physical volume, wherein the bins are configured with wheels to form a trolley, e.g. adapted to hold multiple bin load units, wherein the bin load units comprises component tape reels and SMT feeders mounted so that it can be positioned in an SMT pick and place machine 91 for immediate operation and feed components directly into the SMT pick and place machine 91.

Pallet is in this document to be understood as an accumulator device for electronic components comprised on a component tape reel and adapted with an attachment arrangements allowing storage in a bin, a position in an automated Surface Mount Device (SMD) warehouse and position in an SMT pick and place machine, as would be understood by a person skilled in the art Bin is in this document to be understood as an basket, trolley or accumulator adapted to comprise packet units of component tape reels and optional SMT feeder, pallets or any component handled by an SMT pick and place machine in one or more compartments and adapted with an attachment arrangement allowing storage in a position in an automated Surface Mount Device (SMD) warehouse and an SMT pick and place machine, as would be understood by a person skilled in the art. Alternatively, the bin comprises a bin identity tag, e.g. attached to the bins forward facing surface such that the surface is facing an operator, wherein said identity tag comprises an alphanumerical display controller unit and an alphanumerical display. The alphanumerical display controller can optionally recognize and register bin load units placed in the bin, e.g. by scanning barcodes or RFID tags attached to the bin load units. The scanning may be performed manually by a handheld barcode tag/RFID tag scanner or by a barcode tag/RFID tag scanner integrated in the bin. Alternatively the alphanumerical display controller is configured to communicate data, e.g. identities of recognize and register bin load units, via the communications network to the SMT information database, e.g. such that information on the content of the bin is available in the SMT information database. Alternatively, the bin is further configured with wheels to form a trolley such that the bin can be retrieved manually or automatically from an automated Surface Mount Device (SMD) warehouse 93 and positioned in an SMT pick and place machine 91 for immediate operation. Alternatively, the bin is configured to facilitate block-handling of bin load units such that components can be fed directly into the SMT pick and place machine 91 when the bin load units are placed in the bin, e.g. by configuring the bin to hold SMT feeders mounted on the bin positioned to feed components directly into the SMT pick and place machine 91. Alternatively, wherein the bin load unit comprises an SMT feeder and wherein the alphanumerical display controller is configured to receive data via the communications network from the SMT information database, wherein the data comprises bin load unit related data such as pickup offset and component tape pitch.

Systems

FIG. 1 shows a schematically view of an SMT system 100 comprising an SMT information database 92, an SMT pick and place machine 91, an automated Surface Mount Device (SMD) warehouse 93 and optionally an SMT job planning computing device 95, further detailed in FIG. 1, wherein all the nodes mentioned above are communicatively coupled in a communications network 94. The communications network may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX) and ultrasonic communication, infrared networks etc., but is not limited thereto.

FIG. 2 shows a schematic view of an automated Surface Mount Device (SMD) warehouse 200 adapted to obtain information related to upcoming SMT jobs, to store bins at predetermined positions within said automated Surface Mount Device (SMD) warehouse. The automated Surface Mount Device (SMD) warehouse further comprises a processor/processing unit 210 provided with specifically designed programming or program code portions adapted to control the processing unit to perform the steps and functions of aspect of the technology disclosed of the inventive method described herein. The automated Surface Mount Device (SMD) warehouse further comprises at least one memory 230 configured to store data values or parameters received from a processor 210 or to retrieve and send data values or parameters to a processor 210. The automated Surface Mount Device (SMD) warehouse further comprises a communications interface 240 configured to send or receive data values or parameters to/from a processor 210 to/from external units via the communications interface 240. The automated Surface Mount Device (SMD) warehouse further comprises an actuator 250, such as a robot or robotic arm, adapted to retrieve/store bins, pallets or component tape reels at predetermined positions within the automated Surface Mount Device (SMD) warehouse based on control data received from said processor.

The processor/processing unit 210 may be a processor such as a general or specific purpose processor/processing unit for example a microprocessor, microcontroller or other control logic that comprises sections of code or code portions, stored on a computer readable storage medium, such as a memory 230, that are fixed to perform certain tasks but also other alterable sections of code, stored on a computer readable storage medium, that can be altered during use. Such alterable sections of code can comprise parameters that are to be used as input for the various tasks, such as displaying or processing HTML content or any other parameter related operations known to a person skilled in the art and applied without inventive skill.

The processor/processing unit 210 may be configured to be communicatively coupled and communicate with a memory 230 where data and parameters are kept ready for use by the processing unit 210. The one or more memories 230 may comprise a selection of a hard RAM, disk drive, a floppy disk drive, a magnetic tape drive, an optical disk drive, a CD or DVD drive (R or RW), or other removable or fixed media drive.

Method and Further Systems of the Technology Disclosed

When producing SMT production units in an SMT system a SMT job associated with an SMT production unit is planned or predefined and stored in an SMT information database. Information relating to an SMT job might indicate the number of production units to be produced and component requirements to complete production of the SMT unit by an SMT pick and place machine. In conventional systems this involves retrieving individual component rolls carrying SMT components, transporting and inserting them in a component feeding position at the pick and place machine, where they can provide components to the pick and place machine robot. The invention reduces the complexity and error-prone previous process by providing pre-loaded bins, trays or accumulator devices that are automatically retrieved from the automated Surface Mount Device (SMD) warehouse and presented at a port, slit, outlet or access point to the operator of the pick and place machine and can be inserted directly into the pick and place machine for the upcoming SMT job. As the bins have been pre-loaded with components required at the upcoming SMT job, less actions and preparation work is required by the operator. Information relating to upcoming SMT jobs are obtained, e.g. retrieved from memory, pushed or sent by the SMT information database over a communications network, retrieved over a communications network from the SMT information database or obtained from operator indications to an input/output device of the automated Surface Mount Device (SMD) warehouse. Examples of input data received by the automated Surface Mount Device (SMD) warehouse are SMT job ID, SMT job component requirements, bin ID, pallet ID, component tape reel ID or a parameter representing position in the automated Surface Mount Device (SMD) warehouse.

Figure 6:
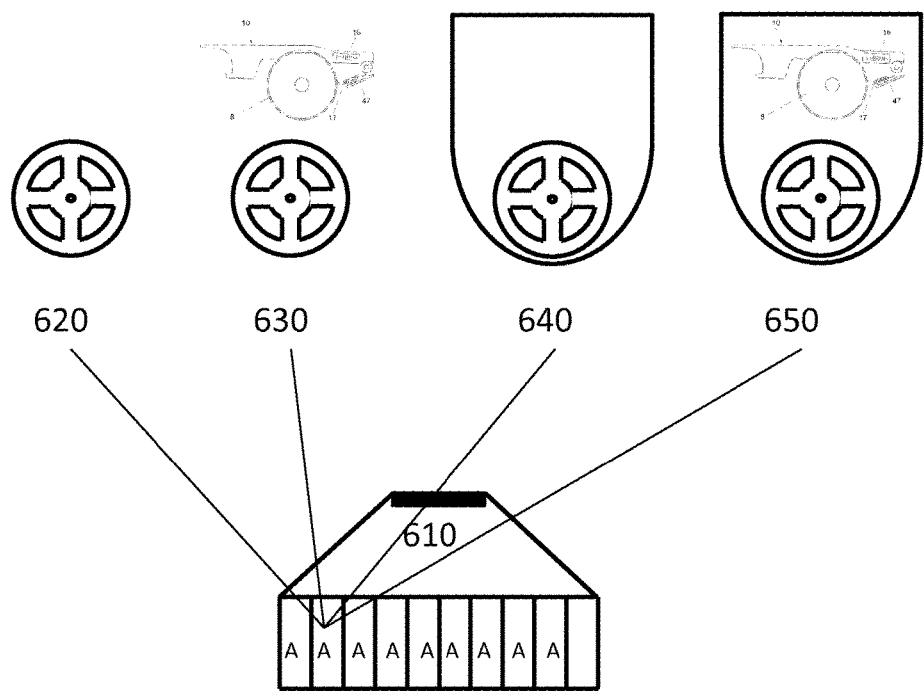
FIG. 6 shows various examples of bin load units, such as component tape reel, component tape reel with feeder, a pallet comprising a component tape reel and a pallet comprising a component tape reel and an SMT feeder.

FIG. 6 shows various examples of bin load units comprised in a bin 610, such as a component tape reel 620, a component tape reel with SMT feeder 630, a pallet comprising a component tape reel 640 and a pallet comprising a component tape reel and an SMT feeder 650. The bin 610 may comprise one or a plurality of compartments or slots adapted to comprise bin load units. The SMT feeder 650 may have a built-in tape advancing mechanism or utilize a tape advancing mechanism of the pick and place machine or the magazine, e.g. a feeding wheel or a protrusion utilizing an internal or external drive such as a linear motor, in the pick-and-place machine or magazine, that protrudes through the tape guide into contact with the pre-threaded tape.

Figure 7A:
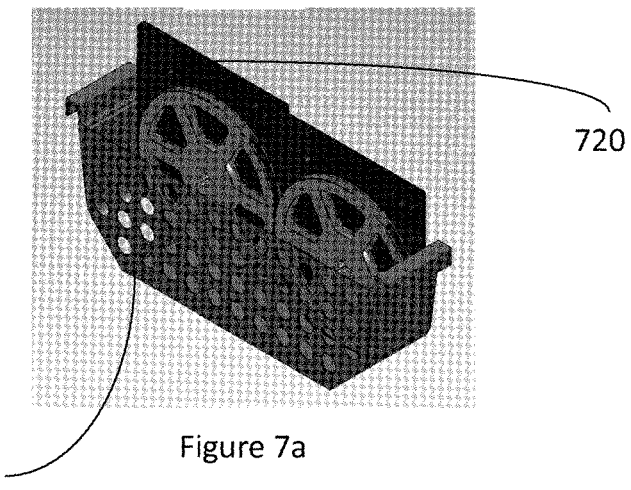
FIG. 7 shows an example of a bin comprising bin load units in the form of pallets comprising component tape reels.
Figure 7B:
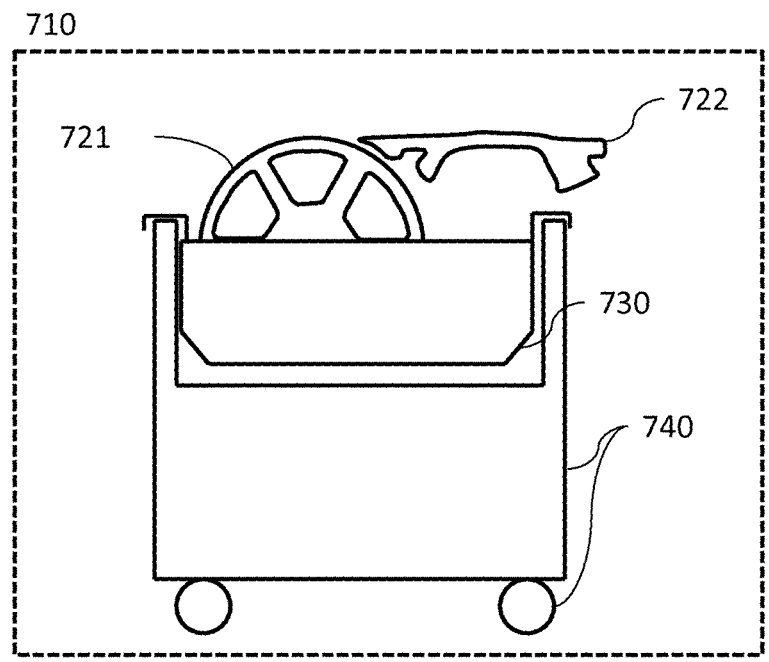

FIG. 7a shows an example of a bin 710 comprising bin load units 720 in the form of pallets comprising component tape reels. FIG. 7b shows yet an example of a bin 710 configured as a trolley. The bin 710 is loaded with a bin load unit consisting of a component tape reel 721 and a SMT feeder 722. The bin 710 further comprises a first compartment section 730 adapted to comprise bin load units and a second chassis section 740 configured to roll on a supporting surface, such as a floor, such that the bin can be moved back and forth between the SMD Warehouse and the Pick-and-Place Machine, be retrieved/stored by an actuator in an automated SMD warehouse and to be inserted directly into the pick and place machine for producing the upcoming SMT job. In one embodiment the first compartment section 730 and the second chassis section 740 is configured as an integral non-separable part. In yet another embodiment the first compartment section 730 and the second chassis section 740 is configured as an separable parts such that the first compartment section 730 can be separated from the second chassis section 740 and stored separately in an automated SMD Warehouse or inserted separately in an SMT pick and place machine.

Figure 11:
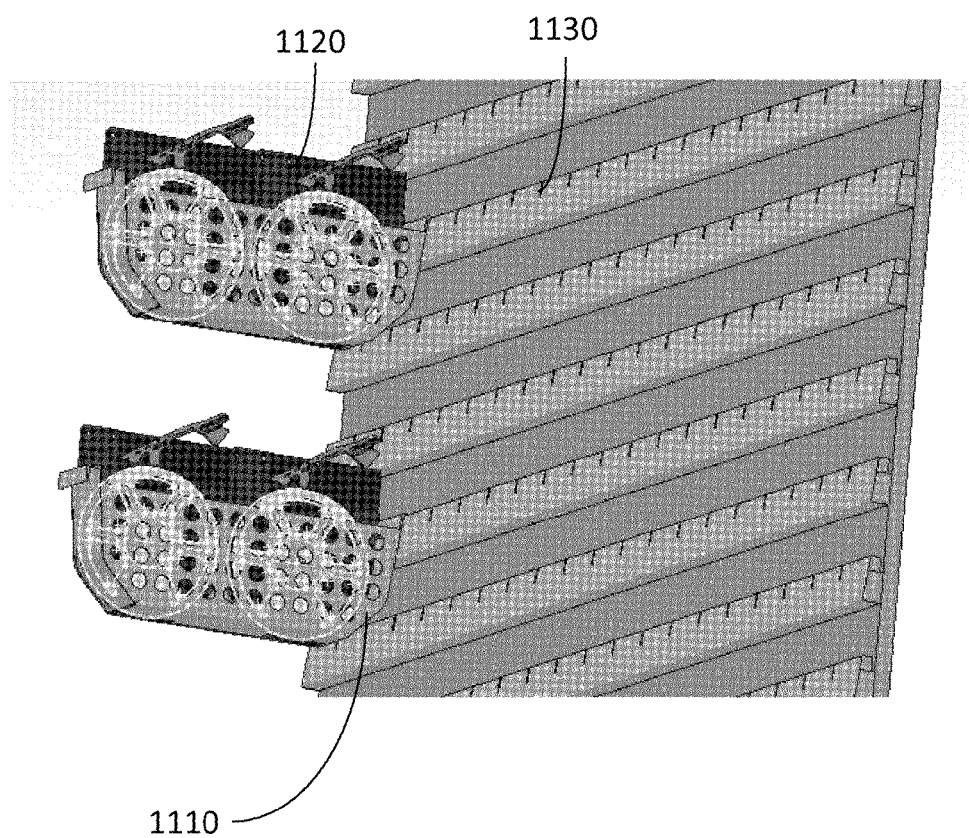
FIG. 11 shows an example of the technology disclosed where a first and a second bin are retrieved from, or stored in, predetermined storage positions in the automated Surface Mount Device (SMD) warehouse.

FIG. 11 shows an example of the technology disclosed where a first 1110 and a second bin 1120 are retrieved from, or stored in, predetermined storage positions 1130 in the automated Surface Mount Device (SMD) warehouse. The attachment of a bin to the storage position might be performed by a hook, an element protruding through a hole, by magnetic means or any other attachment means known to a skilled person.

Figure 15A:
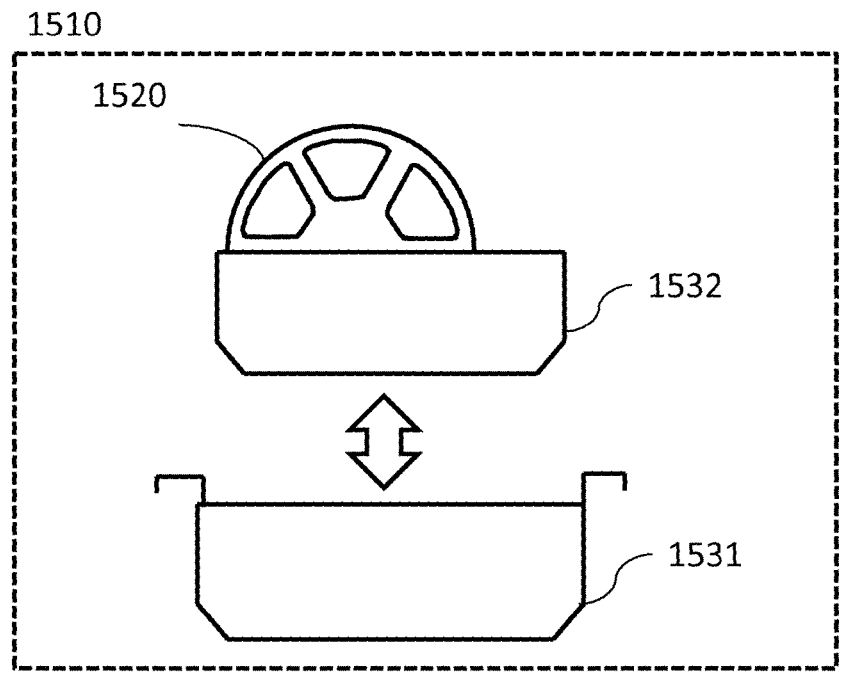
FIG. 15 shows an example of a bin comprising bin a bin load unit compartment section and a receptacle compartment section.
Figure 15B:
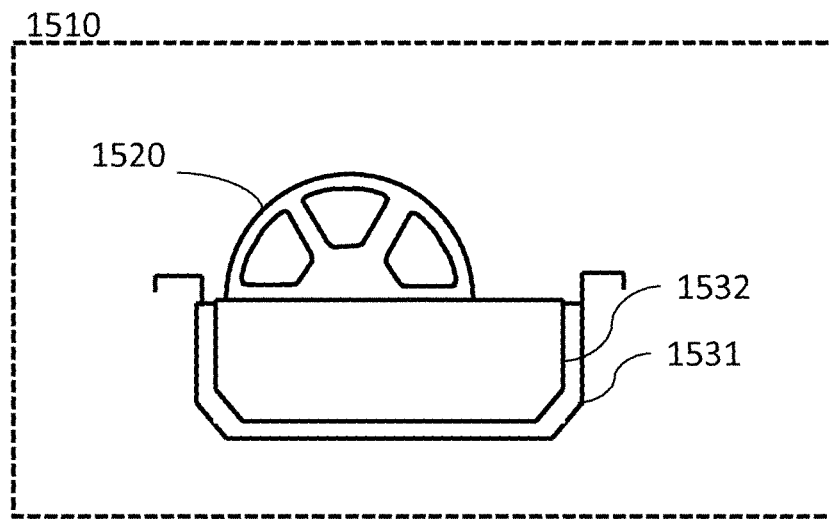

FIG. 15a shows an example of a bin 1510 comprising bin load units 1520 in the form of component tape reels. The bin 1510 is further configured to comprise a third bin load unit compartment section 1532 adapted to comprise bin load units 1520 and a fourth receptacle compartment section 1531 adapted to comprise said third load unit compartment section 1532. The third bin load unit compartment section 1532, can be separated from the fourth receptacle compartment section 1531 and inserted back into the fourth receptacle compartment section 1531 at a later time. The bin 1510 comprising a third load unit compartment section 1532 inserted into the fourth receptacle compartment section 1531 can be inserted directly into the pick and place machine for producing the upcoming SMT job. By replacing the third load unit compartment section 1532 with a different one, e.g. a third load unit compartment section 1532 configured to receive component trays, component sticks or component tape reels, the bin can be more easily reconfigured to be loaded with different type of components depending on requirements of an SMT job. An advantage is that the delay when configuring a pick and place machine for an upcoming SMT job can be reduced. Yet another advantage is that the same fourth receptacle compartment section 1531 can be used for various components by changing the third load unit compartment section 1532.

Improved Storage and Handling of Electronic Components

Figure 3:
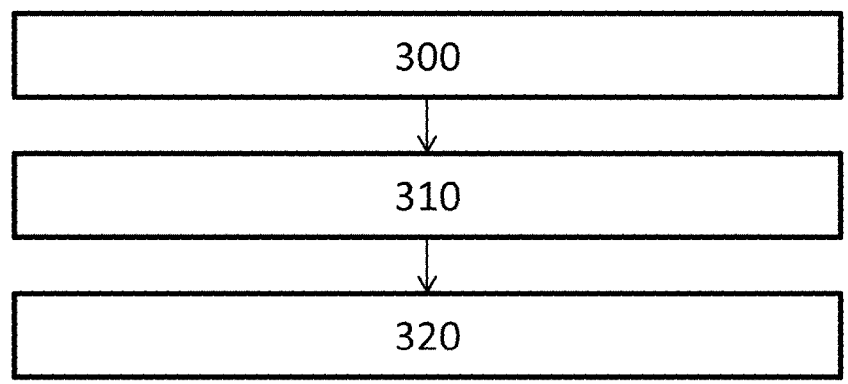
FIG. 3 shows a method in Surface-mount technology (SMT) system for presenting a retrieved bin at a port of an automated Surface Mount Device (SMD) warehouse.

FIG. 3 shows an example of the technology disclosed in the form a method in an automated Surface Mount Device (SMD) warehouse adapted to obtain information related to upcoming SMT jobs, to store bins at predetermined positions within said automated Surface Mount Device (SMD) warehouse and to retrieve bins at predetermined positions within said automated Surface Mount Device (SMD) warehouse, wherein said bins are adapted to comprise bin load units, wherein said bin load unit comprises at least a component tape reel, the method comprising:

300: receiving input data;

310: retrieving a bin based on said input data and a parameter representing a position within said automated Surface Mount Device (SMD) warehouse, wherein said bin is adapted to comprise bin load units, and wherein said bin load unit comprises at least a component tape reel.

320: presenting said retrieved bin at a port of said automated Surface Mount Device (SMD) warehouse.

In yet another aspect of the technology disclosed, there is provided a method in an automated Surface Mount Device (SMD) warehouse adapted to obtain information related to upcoming SMT jobs, to store bins at predetermined positions within said automated Surface Mount Device (SMD) warehouse and to retrieve bins at predetermined positions within said automated Surface Mount Device (SMD) warehouse, wherein said bins are adapted to comprise bin load units, wherein said bin load unit comprises at least a component tape reel, the method comprising:

receiving at least one of input data and a parameter representing a position within said automated Surface Mount Device (SMD) warehouse;

retrieving a bin loaded with a plurality of bin load units from said position within said automated SMD warehouse at least partly based on said at least one of input data and/or a parameter representing said position within said automated Surface Mount Device (SMD) warehouse; and presenting said retrieved bin at, or close to, an output port, such as an opening, of said automated Surface Mount Device (SMD) warehouse.

In one non-limiting example input data descriptive of set of components, component 1, component 2, component P, is received 300. A bin is retrieved based on said input data and a parameter representing a position within said automated Surface Mount Device (SMD) warehouse. In one example, the parameter may be comprised in a data structure stored in the SMD warehouse, such as a table, descriptive of a component tape identity, bin identity or pallet ID and a position within said SMD e.g.:

| Identity | Xposition | Yposition | Z position |
|---|---|---|---|
| component tape identity 1 | X1 | Y1 | Z1 |
| component tape identity 2 | X2 | Y2 | Z2 |
| component tape identity 3 | X3 | Y3 | Z3 |
| component tape identity 4 | X4 | Y4 | Z4 |

In one example, the parameter may be comprised in a data structure, such as a table, descriptive of a component tape identity, bin identity or pallet ID and a position within said SMD e.g.:

| Identity | Shelf ID |
|---|---|
| component tape identity 1 | S1 |
| component tape identity 2 | S2 |
| component tape identity 3 | S3 |
| component tape identity 4 | S4 |

The X, Y, Z position or the shelf ID is obtained by performing a look-up in the parameter table on the input data to obtain the position within said automated SMD warehouse, e.g. (X1, Y1, Z1) or (Shelf 34). The bin or bins located at the obtained position within said automated SMD warehouse is then retrieved and presented at a port of said automated Surface Mount Device (SMD) warehouse.

The automated Surface Mount Device (SMD) warehouse may further comprise an input/output interface and said input data is received from said input/output interface based on an operator indication of an upcoming SMT job.

In one example, an operator enters the identity of an upcoming SMT job, the automated Surface Mount Device (SMD) warehouse retrieves or receives the identities of components associated with, comprised in or required in the upcoming SMT job from said SMT information database, such as component tape reel identity or pallet identity. The X, Y, Z position or the shelf ID is obtained by performing a look-up in the parameter table on the retrieved or received identities of components to obtain the position within said automated SMD warehouse, e.g. (X1, Y1, Z1) or (Shelf 34). The bin or bins located at the obtained position within said automated SMD warehouse is then retrieved and presented at a port of said automated Surface Mount Device (SMD) warehouse.

In one or more examples of the technology disclosed, said input data is received or retrieved from an SMT information database and said input data is associated with or is indicating an upcoming SMT job.

In one example, the input data descriptive of an upcoming SMT job is pushed by or received from the SMT information database via the communications network, the automated Surface Mount Device (SMD) warehouse retrieves or receives the identities of components associated with, comprised in or required in the upcoming SMT job from said SMT information database, such as component tape reel identity or pallet identity. The X, Y, Z position or the shelf ID is obtained by performing a look-up in the parameter table on the retrieved or received identities of components to obtain the position within said automated SMD warehouse, e.g. (X1, Y1, Z1) or (Shelf 34). The bin or bins located at the obtained position within said automated SMD warehouse is then retrieved and presented at a port of said automated Surface Mount Device (SMD) warehouse.

In one or more examples of the technology disclosed, said parameter is representing a position within said automated Surface Mount Device (SMD) warehouse and is retrieved from a memory in said automated Surface Mount Device (SMD) warehouse.

In one example the parameter representing a position within said automated Surface Mount Device (SMD) warehouse is an X, Y, Z position or the shelf ID and is obtained or retrieved by performing a look-up in a parameter table based on the retrieved or received identities of components to obtain the position within said automated SMD warehouse, e.g. (X1, Y1, Z1) or (Shelf 34).

In certain aspects of the technology disclosed, said retrieving of a bin is performed based on an upcoming SMT job, wherein the SMT job comprises data indicative of required components in said upcoming SMT job, wherein said bin has been pre-loaded with bin load units based on said SMT job.

In one example the actuator in the automated SMD warehouse have pre-loaded the bin based on a subset of required components or bill-of-materials in an upcoming SMT job by automatically redistributing stored bin load units in said automated Surface Mount Device (SMD) warehouse based on at least one of SMT job related information received or retrieved from said SMT database.

After finishing an SMT job the operator unloads the bin from the pick and place machine and returns it to the port of the automated Surface Mount Device (SMD) warehouse, that in turn receives the bin and stores it at an available position or storage position within the automated Surface Mount Device (SMD) warehouse by the use of one or more actuators, such as a robot, robot arm or other actuator known to a skilled person.

In yet another example of the technology disclosed provides for a method in an automated Surface Mount Device (SMD) warehouse adapted to obtain information related to upcoming SMT jobs, to store bins at predetermined positions within said automated Surface Mount Device (SMD) warehouse, wherein said bins are adapted to comprise bin load units, wherein said bin load unit comprises at least a component tape reel, the method comprising:
  receiving a bin at a port, such as an opening, of said automated Surface Mount Device (SMD) warehouse;
  storing said bin at a position within said automated Surface Mount Device (SMD) warehouse;
  store said position.

In yet another example of the technology disclosed provides for a method in an automated Surface Mount Device (SMD) warehouse adapted to obtain information related to upcoming SMT jobs, to store bins at predetermined positions within said automated Surface Mount Device (SMD) warehouse, wherein said bins are adapted to comprise bin load units, wherein said bin load unit comprises at least a component tape reel, the method comprising:
  receiving a bin at an input port, such as an opening, of said automated Surface Mount Device (SMD) warehouse;

determining tape reel identities of component tape reels comprised in said bin; and storing said bin at one of said plurality of positions within said automated Surface Mount Device (SMD) warehouse, wherein said bin is comprising a plurality of bin load units, and wherein each of said plurality of bin load units is comprising or constituting a component tape reel.

In one example, an operator provides a bin comprising bin load units at the port of said automated Surface Mount Device (SMD) warehouse. The bin load units in the bin are identified, e.g. by scanning an identity tag or retrieving associated bin load units from the SMT information database. The processor in the automated Surface Mount Device (SMD) warehouse identifies an available position within said automated Surface Mount Device (SMD) warehouse that could accommodate the bin and retrieves the corresponding parameter value from memory. The actuator then stores the received bin at the retrieved position within said automated Surface Mount Device (SMD) warehouse and stores the position within said automated Surface Mount Device (SMD) warehouse associated to bin load unit IDs comprised in the bin in the memory and/or the SMT information database, where bin load unit IDs are e.g. component tape reel ID's or pallet IDs.

In yet another aspect of the technology disclosed, storing said bin further comprises:
determining tape reel identities of component tape reels comprised in said bin;

In one example, determining tape reel identities comprise scanning an identity tag of component tape reels comprised in said bin, where the identity tags are e.g. barcode or RFID tags.

In yet another aspect of the technology disclosed, determining tape reel identities of component tape reels comprised in said bin comprises:
scanning individual identity tags attached to component tape reels; and;
store the identity (ID) of each component tape reel to a memory in said automated Surface Mount Device (SMD) warehouse.

In yet another aspect of the technology disclosed, determining tape reel identities of component tape reels comprised in said bin comprises:
scanning individual identity tags attached to component tape reels; and
storing the identity (ID) of each component tape reel scanned and the position of the stored bin to at least one of a memory in said automated Surface Mount Device (SMD) warehouse and/or in an SMT information database.

In one example, the scanning is performed at the input port of the SMD warehouse with the bin load units positioned in the bin.

In yet another aspect of the technology disclosed, determining tape reel identities of component tape reels comprised in said bin further comprises:
gripping said bin load unit comprised in said bin by an actuator comprised in said automated Surface Mount Device (SMD) warehouse;
moving said bin load to an intermediate position within said automated Surface Mount Device (SMD) warehouse;
replacing said bin load unit in said bin.

In one example, the actuator moves the bin load unit into a position where it can be scanned by a fixed identity tag scanner, e.g. a bar code scanner.

In yet another aspect of the technology disclosed, said individual identity tags are barcodes adapted to be scanned by a barcode scanner unit and through said scanning provide information to the barcode scanner unit of an associated identity.

In yet another aspect of the technology disclosed, determining tape reel identities of component tape reels comprised in said bin comprises:
scanning individual identity tags attached to pallets comprising component tape reels to obtain bin IDs,
retrieve the ID of component tape reel ID associated to pallet ID from said SMT information database.

In yet another aspect of the technology disclosed, determining tape reel identities of component tape reels comprised in said bin comprises:
scanning, or reading, individual identity tags attached to pallets comprising component tape reels, whereby individual pallet IDs are obtained from said scanning or reading of individual identity tags attached to pallets; and
retrieving the ID of component tape reels associated with said obtained pallet IDs from said SMT information database.

In one example, the component tape IDs are associated with respective pallet ID's in the SMT information database, the pallet IDs are obtained by scanning identity tags attached to the pallets and the IDs of component tape reels associated to the scanned pallet ID from said SMT information database using database lookup, as would be understood by a person skilled in the art.

In yet another aspect of the technology disclosed, determining tape reel identities of component tape reels comprised in said bin comprises:
scanning an identity tag attached to said bin to obtain bin ID's; and
retrieving the IDs of component tape reel IDs associated to said bin IDs from said SMT information database.

In one example, the component tape ID's are associated with respective bin ID's in the SMT information database, the bin ID's are obtained by scanning identity tags attached to the bins and the ID's of component tape reels associated to the scanned bin ID from said SMT information database using database lookup, as would be understood by a person skilled in the art.

In yet another aspect of the technology disclosed, said identity tag is one of a EAN-13, EAN-8, UPC, Code 39, GS1-128, AI, Code 128, ITF-14, ITF-14, GS1 Datamatrix, GS1 Databar, Industrial 2 of 5, Industrial 2 of 5 Interleaved, 3-DI, ArrayTag, Aztec Code, Small Aztec Code, Codablock, Code 1, Code 16K, Code 49, ColorCode, Color Construct Code, Compact Matrix Code, CP Code, CyberCode, d-touch, DataGlyphs, Data Matrix, Datastrip Code, Dot Code A, EZcode, Grid Matrix Code, HD Barcode, High Capacity Color Barcode, HueCode, INTACTA.CODE, InterCode, JAGTAG, MaxiCode, mCode, MiniCode, MicroPDF417, MMCC, Nintendo e-Reader#Dot code, Optar, PaperDisk, PDF417, PDMark, QR Code, QuickMark Code, Secure Seal, SmartCode, Snowflake code, ShotCode, SPARQCode, SuperCode, Trillcode, UltraCode, UnisCode, VeriCode, VSCode, WaterCode and Radio Frequency Identification (RFID) tags.

In yet another aspect of the technology disclosed, said position is stored as a parameter representing a position within said automated Surface Mount Device (SMD) warehouse.

In one example, wherein said position is an X, Y, Z coordinate or a shelf identity.

SMD System

In yet another aspect of the technology disclosed, an automated Surface Mount Device (SMD) warehouse system is comprising:
- a processor;
- an actuator communicatively coupled to said processor, such as a robot or robotic arm, adapted to retrieve or store bins, pallets or component tape reels at predetermined positions within the automated Surface Mount Device (SMD) warehouse based on control data received from a processor,
- a memory wherein said processor is adapted
- to obtain information related to upcoming SMT jobs,
- to store bins at predetermined positions within said automated Surface Mount Device (SMD) warehouse by sending control data to said actuator, wherein said bins are adapted to comprise bin load units, wherein said bin load unit comprises at least a component tape reel, wherein said processor in said automated Surface Mount Device (SMD) warehouse adapted to perform the steps of:
- receiving input data;
- retrieving a bin based on said input data and a parameter representing a position within said automated Surface Mount Device (SMD) warehouse by sending control data to said actuator, wherein said bin is adapted to comprise bin load units, wherein said bin load unit comprises at least a component tape reel
- presenting said retrieved bin by said actuator at a port of said automated Surface Mount Device (SMD) warehouse by sending control data to said actuator In yet another aspect of the technology disclosed, the system further comprising an input/output interface and said input data is received from said input/output interface based on an operator indication of an upcoming SMT job In yet another aspect of the technology disclosed, the system further comprising a communications interface and said input data is received from said SMT information database via a communications network and said input data is associated with (indicating) an upcoming SMT job In yet another embodiment, an automated Surface Mount Device (SMD) warehouse comprising:
a processor, and
an actuator, such as a robot or robotic arm, communicatively coupled to said processor;
wherein said processor is configured to receiving at least one of input data and a parameter representing a position within said automated Surface Mount Device (SMD) warehouse and to send control data to the actuator at least partly based on the obtained information and/or instructions;
wherein the actuator is configured to retrieve a bin from said position within the automated Surface Mount Device (SMD) warehouse and presenting said retrieved bin at, or close to, an output port, such as an opening, of said automated Surface Mount Device (SMD) warehouse based on control data received from said processor The automated SMD warehouse of claim 11, further comprising an input/output interface, and wherein said processor is configured to receive input data from said input/output interface based on an operator indication of an upcoming SMT job.

The automated SMD warehouse of any of claims 11 to 12, further comprising a communications interface configured to receive and/or retrieve input data from a SMT information database via a communications network, wherein said processor is further configured to receive input data from said communications network, wherein said input data is associated with, or is indicating, an upcoming SMT job.

The automated SMD warehouse of claim 20, wherein said retrieved bin is loaded with a plurality of bin load units, said bin load units each comprising or constituting a component tape reel.

In yet another aspect of the technology disclosed, an automated Surface Mount Device (SMD) warehouse system is comprising:
- an actuator, such as a robot or robotic arm, adapted to retrieve or store bins, pallets or component tape reels at predetermined positions within the automated Surface Mount Device (SMD) warehouse based on control data received from a processor,
- a memory
- a processor, adapted to
- to obtain information related to upcoming SMT jobs,
- to store bins at predetermined positions within said automated Surface Mount Device (SMD) warehouse by sending control data to said actuator, wherein said bins are adapted to comprise bin load units, wherein said bin load unit comprises at least a component tape reel, wherein said processor in said automated Surface Mount Device (SMD) warehouse adapted to perform the steps of:
- receiving a bin at a port of said automated Surface Mount Device (SMD) warehouse by controlling said actuator with control data;
- storing said bin at a position within said automated Surface Mount Device (SMD) warehouse by said actuator with control data;
- store said position In one or more embodiments, wherein said processor is further adapted to perform any of the steps of the methods described herein In yet another aspect of the technology disclosed, an automated Surface Mount Device (SMD) warehouse system, said system comprising:
- an actuator, such as a robot or robotic arm, adapted to retrieve or store bins, pallets or component tape reels at predetermined positions within the automated Surface Mount Device (SMD) warehouse based on control data received from a processor,
- a memory
- a processor configured to obtain information related to upcoming SMT jobs;

wherein said actuator is configured to store bins at predetermined positions within said automated Surface Mount Device (SMD) warehouse by receiving control data from said processor, and wherein said bins are adapted to comprise bin load units, wherein said bin load unit comprises at least a component tape reel,
and wherein said processor of said automated Surface Mount Device (SMD) warehouse system is further configured to control the steps of:
- receiving a bin at a port of said automated Surface Mount Device (SMD) warehouse by providing said actuator with control data; and
- storing said bin at a position within said automated Surface Mount Device (SMD) warehouse by providing said actuator with said control data.

In yet another aspect of the technology disclosed, a computer program product comprising computer readable code is configured to, when executed in a processor, perform any or all of the method steps of the methods described herein.

In yet another aspect of the technology disclosed, a non-transitory computer readable memory on which is stored computer readable code is configured to, when executed in a processor, perform any or all of the method steps of the methods described herein.

In yet another aspect of the technology disclosed, a computer program product comprising computer readable code is configured to, when executed in a processor, perform any or all of the method steps of the methods described herein.

In yet another aspect of the technology disclosed, a non-transitory computer readable memory on which is stored computer readable code is configured to, when executed in a processor, perform any or all of the method steps of the methods described herein.

Providing Information Regarding an SMT Job

To operate the SMT system an operator responsible for monitoring the production of the SMT production units, to retrieve components from the SMD warehouse and to insert components in positions in the SMT pick and place machine. Today these tasks are performed by manual methods such as printouts. There is a need to provide the operator with dynamic information, e.g. into which position a retrieved component should be inserted in the SMT pick and place machine or which components that are about to run out when the SMT pick and place machine is in production of SMT production units. With improved information obtained by the operator, the risk of erroneous insertion in the SMT pick and place machine can be reduced and the time required to stop the production to replace a component tape reel can be reduced.

In one or more embodiments, a method for providing operator information in an Surface Mount Technology (SMT) system comprising an SMT information database, a SMT pick and place machine where SMT production have been started and an identity tag scanner, wherein SMT production at least comprises feeding components from a bin load unit to the SMY pick and place machine, the method comprising:
  receiving a bin in said SMT pick and place machine, wherein said bin is adapted to comprise vertically oriented bin load units, wherein said bin load unit has an bin load unit identity tag attached to the bin load unit upwards facing surface
  scanning individual identity tags attached to pallets comprising component tape reels to obtain pallet ID's In one or more aspect of the technology disclosed describes a method for providing operator information in a Surface Mount Technology (SMT) system comprising an SMT information database, a SMT pick and place machine and an identity tag scanner, the method comprising:
  receiving a bin in said SMT pick and place machine, wherein said bin is adapted to comprise vertically oriented bin load units, wherein said bin load unit has an bin load unit identity tag attached to the bin load unit upwards facing surface
  starting SMT production on said SMT pick and place machine;
  scanning individual identity tags attached to bin load units comprising component tape reels to obtain bin load IDs In one or more embodiments, wherein said bin load units are comprised in pallets.

In one or more aspect of the technology disclosed describes a method for providing operator information in a Surface Mount Technology (SMT) system comprising an SMT information database, a SMT pick and place machine and an identity tag scanner, the method comprising:
  receiving a bin in said SMT pick and place machine, wherein said bin is adapted to comprise vertically oriented pallets, wherein said pallet has an pallet identity tag attached to the pallets upwards facing surface
  starting SMT production on said SMT pick and place machine;
  scanning individual identity tags attached to pallets comprising component tape reels to obtain pallet ID's In one example, the bin load units are comprised in pallets. Individual identity tags attached to pallets are scanned to obtain pallet IDs. The pallet ID is associated to other identities, such as component IDs, bin IDs, component tape reel IDs etc., in the SMT information database and the associated ID can be retrieved and presented to an operator on a display on the scanner or on the pick and place machine.

In yet another aspect of the technology disclosed, a method for providing operator information in an Surface Mount Technology (SMT) system comprising an SMT information database and a SMT pick and place machine where SMT production have been started, wherein started SMT production at least comprises feeding components from a bin load unit to the SMY pick and place machine, the method comprising:
  receiving a bin in said SMT pick and place machine, wherein said bin comprises an alphanumerical display controller unit and a alphanumerical display
  receiving display data relating to an SMT job via a communications network;
  present said display data on said alphanumerical display In yet another aspect of the technology disclosed describes a method for providing operator information in a Surface Mount Technology (SMT) system comprising an SMT information database and a SMT pick and place machine, the method comprising:
  receiving a bin in said SMT pick and place machine, wherein said bin has a bin identity tag attached to the bins forward facing surface such that the surface is facing an operator, wherein said identity tag comprises an alphanumerical display controller unit and a alphanumerical display
  starting SMT production on said SMT pick and place machine;
  receiving display data relating to an SMT job from said SMT information database;
  present said display data on said alphanumerical display.

In one example, the bin load units are comprised in a bin configured with a bin identity tag attached to the bins forward facing surface such that the surface is facing an operator, wherein said identity tag comprises an alphanumerical display controller unit and an alphanumerical display. Data relating to the number of components remaining in a bin load unit, such as a component tape reel, is continuously sent from the pick and place machine to the SMT information database. A selection of the identity of the pick and place machine, the location into where the bin should be placed in the pick and place machine, the type of component and the number of remaining component is received as display data and presented on the alphanumerical display.

In one or more embodiments, wherein said display data is received via a communications network.

In one or more embodiments, wherein said communications network is a wireless communications network.

In one or more embodiments, wherein said display data is relating to an SMT job retrieved from said SMT information database In one or more embodiments, wherein said bin has a bin identity tag in the form of a bar code attached to the bins forward facing surface such that the surface is facing an operator In one or more embodiments, wherein said communications network is an infrared network or an wireless local area network (WLAN).

In one or more embodiments, wherein the method further comprises sending said display information to an IR based system.

In one or more embodiments, wherein said display data is pushed down from a separate system.

In one or more embodiments, wherein the method step of receiving display data is preceded by scanning individual identity tags attached to bin load units, pallets, bins or pick and place machine magazines.

In one example, the display data is received only after an individual identity tag has been scanned by an operator.

In yet another aspect of the technology disclosed describes a Surface Mount Technology (SMT) system for providing operator information comprising:
   an SMT information database,
   a SMT pick and place machine; and;
   an identity tag scanner,
wherein said system is adapted to
   receiving a bin in said SMT pick and place machine, wherein said bin is adapted to comprise vertically oriented bin load units, wherein said bin load units has an bin load units identity tag attached to the bin load units upwards facing surface, In one or more embodiments, wherein said bin load units are comprised in pallets In yet another aspect of the technology disclosed describes a bin in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, the bin comprising:
   an alphanumerical display controller unit and an alphanumerical display, wherein said controller is configured to:
   receiving display data relating to an SMT job pushed down from a separate system via a communications network;
   present said display data on said alphanumerical display In yet another aspect of the technology disclosed, said display data comprises a selection of SMT job ID, predetermined component feeder position in the SMT pick and place machine, component type and remaining number of components on a component tape reel comprised in said bin In yet another aspect of the technology disclosed, a Surface Mount Technology (SMT) system for providing operator information is comprising:
   an SMT information database,
   a SMT pick and place machine; and;
   an identity tag scanner,
   Wherein said system is adapted to
   receiving a bin in said SMT pick and place machine, wherein said bin is adapted to comprise vertically oriented pallets, wherein said pallet has an pallet identity tag attached to the pallets upwards facing surface, In yet another aspect of the technology disclosed, a bin in a Surface Mount Technology (SMT) system is used for providing operator information, where the technology disclosed is enabling that said bin is adapted to be received in a SMT pick and place machine, and wherein said bin has a bin identity tag attached to the bins forward facing surface such that the surface is facing an operator, wherein said identity tag may also, or alternatively, comprise an alphanumerical display controller unit and a alphanumerical display.

Optimizing Presentation of Components in an SMD Warehouse

In order to reduce retrieval time in an automated Surface Mount Device (SMD) warehouse and speed up preparation of the SMT pick and place machine with components required to start production there is a need to optimize the configuration of stored units in the automated Surface Mount Device (SMD) warehouse. Idle time, e.g. when no storage or retrieval is performed by the automated Surface Mount Device (SMD) warehouse, may be used to pre-load bins with components required in an upcoming SMT job, to rearrange and optimize storage space within the automated Surface Mount Device (SMD) warehouse and to place stored units, such as bins or pallets, that are expected to be used within a foreseeable future, close to the port of the automated Surface Mount Device (SMD) warehouse. The bin load units are provided with identity tags that might be scanned individually and the identity of the tag together with the storage position of the bin is stored in memory coupled to the processor of the automated Surface Mount Device (SMD) warehouse In one or more aspect of the technology disclosed, a method is described for optimizing presentation of bin load units at a port in an automated Surface Mount Device (SMD) warehouse adapted to obtain information related to upcoming SMT jobs, the method comprising:
   automatically redistributing stored bin load units based on predetermined rules to optimize presentation of bin load units at a port of said automated Surface Mount Device (SMD) warehouse based on information relating to upcoming SMT jobs In one or more embodiments, wherein said bin load units are in said automated Surface Mount Device (SMD) warehouse, wherein redistributing if further based on SMT job related information received or retrieved from said SMT database.

In one example, a data structure indicating required components or bills-of-material for upcoming SMT jobs is received from the SMT information database. Bin load units corresponding to upcoming SMT jobs are loaded into bins and the bins are redistributed or moved based on predetermined rules to optimize presentation of bin load units at a port of said automated Surface Mount Device (SMD) warehouse.

In yet another aspect of the technology disclosed, said stored bin load units are comprised in individual stored pallets In one example a component tape reel and/or a SMT feeder is comprised in a pallet and the pallet is loaded into a bin.

In yet another aspect of the technology disclosed, said stored bin load units are comprised in one or more stored bins In one example a component tape reel and/or a SMT feeder is loaded into a bin.

In yet another aspect of the technology disclosed, said predetermined rules are based on information on component requirements of upcoming SMT jobs.

In yet another aspect of the technology disclosed, wherein at least one of said predetermined rules and said SMT job related information received or retrieved from said SMT database are based on, or provides, information on component requirements of upcoming SMT jobs.

In one example, information relating to upcoming SMT jobs SMT1, SMT2 and SMT3 is received, where the information comprises at least the required components or bills-of-material for upcoming SMT jobs SMT1, SMT2 and SMT3 and the sequential order they are planned to be executed or produced in the pick and place machine. The predetermined rule is dependent on the sequential order SMT1, SMT2 and SMT3, thus bin load units comprising required components in SMT1 would be loaded into bins an placed or located closest to the port of the automated Surface Mount Device (SMD) warehouse. Bin load units comprising required components in SMT2 would further be loaded into bins a placed or located second closest to the port of the automated Surface Mount Device (SMD) warehouse and so forth. Redistribution based on information on component requirements of upcoming SMT jobs is further described in relation to FIG. 14.

In yet another aspect of the technology disclosed, wherein at least one of said predetermined rules and said SMT job related information received or retrieved from said SMT database are based on, or provides, information on frequency of component use in previous SMT jobs.

In one example, the predetermined rule is dependent on frequency of use. Statistical information relating to component requirements of previously executed SMT jobs is retrieved from a memory in the automated Surface Mount Device (SMD) warehouse or from the SMT information database, example of statistical information indicating a high frequency of use is total number of components used or total number of components used per time unit. Bin load units comprising components with associated statistical information indicating the highest frequency of use would be loaded into bins an placed or located closest to the port of the automated Surface Mount Device (SMD) warehouse. Bin load units comprising components with associated statistical information indicating the second highest frequency of use would be loaded into bins a placed or located second closest to the port of the automated Surface Mount Device (SMD) warehouse and so forth.

In yet another aspect of the technology disclosed, wherein at least one of said predetermined rules and said SMT job related information received or retrieved from said SMT database are based on, or provides, user indication data from received user indications.

In one example, the predetermined rule is dependent on user indication data. User indication data is received that indicate an operator's preferred order of components. Bin load units comprising components indicated in the user indication data would be loaded into bins a placed or located closest to the port of the automated Surface Mount Device (SMD) warehouse in the order indicated in the user indication data.

In yet another aspect of the technology disclosed, said predetermined rules are based on information on frequency of component use in previous SMT jobs.

In yet another aspect of the technology disclosed, said predetermined rules are based on user indication data from received user indications The automated Surface Mount Device (SMD) warehouse may be configured in different manners to redistribute bin load units and bins within the automated Surface Mount Device (SMD) warehouse. In one embodiment, the automated Surface Mount Device (SMD) warehouse is configured with a first and a second actuator that cooperate when redistributing bin load units.

In yet another aspect of the technology disclosed, the method of automatically redistributing bin load units further comprises:
removing a first bin load unit comprised in a first stored bin by a first actuator comprised in said automated Surface Mount Device (SMD) warehouse;
move said first actuator to a position of a second stored bin within said automated Surface Mount Device (SMD) warehouse
removing a second bin load unit comprised in a second stored bin by a second actuator comprised in said automated Surface Mount Device (SMD) warehouse;
insert said first bin load unit in said second stored bin by said first actuator Bin load units loaded in the same bin may be redistributed within the same bin, e.g. to optimize the utilization of a bin.

In yet another aspect of the technology disclosed, said first stored bin and said second stored bin are the same bin Sometimes the redistribution of bin load units might involve shifting a first bin load unit to a bin already loaded with a second bin load unit and further shifting said second bin load unit to a third bin.

In yet another aspect of the technology disclosed, the method further comprises:
move said second actuator to a position of a third stored bin within said automated Surface Mount Device (SMD) warehouse
insert said second bin load unit in said third stored bin by said second actuator In one embodiment of the invention, the automated Surface Mount Device (SMD) warehouse comprises a dedicated redistribution area, where bin load units can be redistributed between at least two bins.

In yet another aspect of the technology disclosed, the method of automatically redistributing bin load units further comprises:
retrieving a first stored bin to an redistribution area within said automated Surface Mount Device (SMD) warehouse
retrieving a second stored bin to said redistribution area within said automated Surface Mount Device (SMD) warehouse In one embodiment of the invention, the automated Surface Mount Device (SMD) warehouse comprises a table attached to a first or second actuator, where bin load units can be redistributed between at least two bins. Typically, two bins would be placed on the table and bin load units would be redistributed from the first bin to the second bin and vice versa.

In yet another aspect of the technology disclosed, the method of automatically redistributing bin load units further comprises:
retrieving a first stored bin to a table attached to an actuator comprised in said automated Surface Mount Device (SMD) warehouse
move said actuator to a position of a second stored bin within said automated Surface Mount Device (SMD) warehouse To allow flexible scaling of the automated Surface Mount Device (SMD) warehouse, several SMD warehouse units can be coupled together, so that bins can be passed from a first SMD warehouse to a second SMD warehouse and bin load units can be passed from a first SMD warehouse to a second SMD warehouse. Thus, redistribution of bin load units can be obtained between a plurality of automated Surface Mount Device (SMD) warehouses.

In yet another aspect of the technology disclosed, redistributing bin load units further comprises bins comprised in a plurality of automated Surface Mount Device (SMD) warehouses To further enhance the operation of actuators in the automated SMD warehouse, the bin can be configured with a predetermined gripping area for the actuator to grip. The bin can further be configured with guide rails for each compartment in the bin, wherein each compartment is adapted to receive a pallet.

In yet another aspect of the technology disclosed, said bin is adapted with a predetermined gripping area for the actuator to grip and guide rails, wherein said guide rails are adapted to receive a pallet.

To further enhance the operation of actuators in the automated SMD warehouse, the pallet can be configured with a predetermined gripping area for the actuator to grip. The pallet can further be configured with guide rails for each compartment in the bin, wherein each compartment is adapted to receive a pallet protrusion disposed on an outer surface of said pallet to engage said guide rail of said bin. The retaining precision of bin load units loaded in the bin, e.g. when feeding components into a pick and place machine, can be improved by the protrusions.

In yet another aspect of the technology disclosed, said bin load units further comprises a pallet adapted to comprise a component tape reel, wherein said pallet is adapted with a predetermined gripping area for the actuator to grip and a protrusion disposed on an outer surface of said pallet to engage said guide rail of said bin In yet another aspect of the technology disclosed, said bins are adapted to comprise bin load units, wherein said bin load unit comprises at least a component tape reel In yet another aspect of the technology disclosed, wherein redistributing is performed during idle periods, wherein idle periods comprises periods when the automated Surface Mount Device (SMD) warehouse is not occupied with storing or retrieving bins.

In yet another aspect of the technology disclosed provides an automated Surface Mount Device (SMD) warehouse system for optimizing presentation of bin load units at a port comprising:
  an actuator, such as a robot or robotic arm, adapted to retrieve or store bins, pallets or component tape reels at predetermined positions within the automated Surface Mount Device (SMD) warehouse based on control data received from a processor,
  a memory
  a processor, adapted to
  to obtain information related to upcoming SMT jobs,
  to store or retrieve bin load units at predetermined positions within said automated Surface Mount Device (SMD) warehouse by sending control data to said actuator,
wherein said processor is adapted to further perform the steps of:
  automatically redistributing stored bin load units by sending control data to said actuator based on predetermined rules to optimize presentation of bin load units at a port of said automated Surface Mount Device (SMD) warehouse based on information relating to upcoming SMT jobs In yet another aspect of the technology disclosed, an automated Surface Mount Device (SMD) warehouse for redistributing bin load units in an automated Surface Mount Device (SMD) warehouse, where said automated SMD warehouse is configured to obtain information related to upcoming SMT jobs from an SMT database, comprising:
  a first actuator, such as a robot or robotic arm, configured to automatically redistributing stored bin load units in said automated Surface Mount Device (SMD) warehouse based on at least one of SMT job related information obtained from said SMT database and predetermined rules for optimizing presentation of bin load units at a port of said automated Surface Mount Device (SMD) warehouse, wherein said SMT job related information is received or retrieved by a processor and stored to a memory comprised in said Surface Mount Device (SMD) warehouse.

In yet another aspect of the technology disclosed, the automated Surface Mount Device (SMD) warehouse, further comprising a second actuator, such as a robot or robotic arm, configured to automatically redistributing stored bin load units in said automated Surface Mount Device (SMD) warehouse based on at least one of said SMT job related information and said predetermined rules.

In yet another aspect of the technology disclosed, the automated Surface Mount Device (SMD) warehouse, further comprising a redistribution area within said automated Surface Mount Device (SMD) warehouse.

In yet another aspect of the technology disclosed, the automated Surface Mount Device (SMD) warehouse, further comprising a table attached to said first actuator or a second actuator comprised in said automated Surface Mount Device (SMD) warehouse.

In yet another aspect of the technology disclosed, the automated Surface Mount Device (SMD) warehouse, wherein said first or second actuator is configured to receive control data based on at least one of said predetermined rules to optimize presentation of bin load units at a port of said automated Surface Mount Device (SMD) warehouse and said information obtained from an SMT database.

In yet another aspect of the technology disclosed, wherein said stored bin load units are comprised in individual stored pallets.

In yet another aspect of the technology disclosed, wherein said stored bin load units are comprised in one or more stored bins.

In yet another aspect of the technology disclosed an automated Surface Mount Device (SMD) warehouse system for optimizing presentation of bin load units at a port comprising:
  an actuator, such as a robot or robotic arm, configured to retrieve or store bins, pallets or component tape reels at predetermined positions within the automated Surface Mount Device (SMD) warehouse based on control data received from a processor,
  a memory
  a processor, adapted to
  to obtain information related to upcoming SMT jobs,
  to store or retrieve bin load units at predetermined positions within said automated Surface Mount Device (SMD) warehouse by sending control data to said actuator,
wherein said processor is adapted to further control the steps of:
  automatically redistributing stored bin load units by sending control data to said actuator based on at least one of predetermined rules to optimize presentation of bin load units at a port of said automated Surface Mount Device (SMD) warehouse and information received or retrieved from an SMT database.

In yet another aspect of the technology disclosed, said processor in said automated Surface Mount Device (SMD) warehouse adapted to further perform the method steps of described herein In yet another aspect of the technology disclosed, a computer program product is provided for optimizing presentation of bin load units at a port comprising computer readable code configured to, when executed in a processor, perform any or all of the method steps described herein.

In yet another aspect of the technology disclosed, a non-transitory computer readable memory is provided on which is stored computer readable code configured to optimizing presentation of bin load units at a port and to, when executed in a processor, perform any or all of the method steps described herein.

Identifying a Bin in an SMT System

When an operator is returning a bin to the automated Surface Mount Device (SMD) warehouse there is a need to determine the bin load units comprised in a bin by scanning a bin ID and retrieving the associated bin load units ID, such as pallet ID, component tape reel ID and SMT feeder ID, from an SMT information database.

When an operator is retrieving a bin from the automated Surface Mount Device (SMD) warehouse there is a need to associate a bin ID with the comprised bin load units ID's, such as pallet ID, component tape reel ID and SMT feeder ID, by scanning a bin ID and storing the associated bin load units ID's, such as pallet ID, component tape reel ID and SMT feeder ID, to an SMT information database.

In one or more aspect of the technology disclosed, a method in an automated Surface Mount Device (SMD) warehouse configured to store bins at predetermined positions within said automated Surface Mount Device (SMD) warehouse, the method comprising:
  receiving a bin at a port of said automated Surface Mount Device (SMD) warehouse;
  scanning an identity tag attached to said bin to obtain a bin ID.

In one or more aspect of the technology disclosed, the method further comprising:
  storing said bin at a position within said automated Surface Mount Device (SMD) warehouse;

In one or more aspect of the technology disclosed, the method further comprising:
  storing said position and said bin ID in a memory of said automated Surface Mount Device (SMD) warehouse.

In one or more aspect of the technology disclosed describes a method in an automated Surface Mount Device (SMD) warehouse adapted to obtain information related to upcoming SMT jobs, to store bins at predetermined positions within said automated Surface Mount Device (SMD) warehouse, the method comprising:
  receiving a bin at a port of said automated Surface Mount Device (SMD) warehouse;
  scanning an identity tag attached to said bin to obtain a bin ID
  storing said bin at a position within said automated Surface Mount Device (SMD) warehouse;
  storing said position and said bin ID In yet another aspect of the technology disclosed, the method further comprising:
  presenting said retrieved bin at a port of said automated Surface Mount Device (SMD) warehouse In yet another aspect of the technology disclosed, said bins are adapted to comprise bin load units, wherein said bin load unit comprises at least a component tape reel In yet another aspect of the technology disclosed, storing said position and said bin ID further comprises storing said position and said bin ID represented as parameters, such as a table, in a memory of said automated Surface Mount Device (SMD) warehouse In yet another aspect of the technology disclosed, storing said position and said bin ID further comprises storing said position and said bin ID represented as parameters in an SMT information database via a communications network.

In one or more embodiments, a bin is configured with an alphanumerical display, with an integrated alphanumerical display controller, and a printed identity tag attached to said bin such that information relating to an SMT job is displayed and a bin ID can be obtained by scanning, e.g. optically scanning a bar code, the printed identity tag.

In one or more embodiments, wherein a bin is configured with an alphanumerical display with an integrated alphanumerical display controller, wherein display data comprises a bin ID, wherein said bin ID is presented as an optically scanned code such as a bar code, QR code or the like.

In one or more embodiments, an alphanumerical display will function as well as an identity tag of the bin. In one or more embodiment the communications network ID of the alphanumerical display, used to send data to and receive data from the alphanumerical display controller, is identical to the bin ID.

In one or more embodiments, wherein scanning comprises scanning an optically scanned code such as a bar code, QR code or the like, wherein the optically scanned code is presented on a printed label or an alphanumerical display.

In one example, the alphanumeric display attached to a bin is displaying a bar code representing a unique bin ID of the bin.

In one or more embodiments, wherein said Surface Mount Device (SMD) warehouse and at least a second Surface Mount Device (SMD) warehouse are configured to form an integrated automated Surface Mount Device (SMD) warehouse cluster, wherein bin load units may be redistributed between a first and a second automated Surface Mount Device (SMD) warehouse via a first opening in the automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be redistributed from said first Surface Mount Device (SMD) warehouse and said second Surface Mount Device (SMD) warehouse.

In the technology disclosed, a plurality of automated Surface Mount Device (SMD) warehouse may be configured to form an integrated automated Surface Mount Device (SMD) warehouse cluster, wherein bin load units may be redistributed between a first and a second automated Surface Mount Device (SMD) warehouse via a first opening in the first automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be passed or redistributed from said first Surface Mount Device (SMD) warehouse to said second Surface Mount Device (SMD) warehouse and vice versa.

In one or more embodiments, wherein said Surface Mount Device (SMD) warehouse and at least a second Surface Mount Device (SMD) warehouse are configured to form an integrated automated Surface Mount Device (SMD) warehouse cluster, wherein bin load units may be redistributed between a first and a second automated Surface Mount Device (SMD) warehouse via a first opening in the automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be redistributed from said first Surface Mount Device (SMD) warehouse and said second Surface Mount Device (SMD) warehouse.

Figure 20:
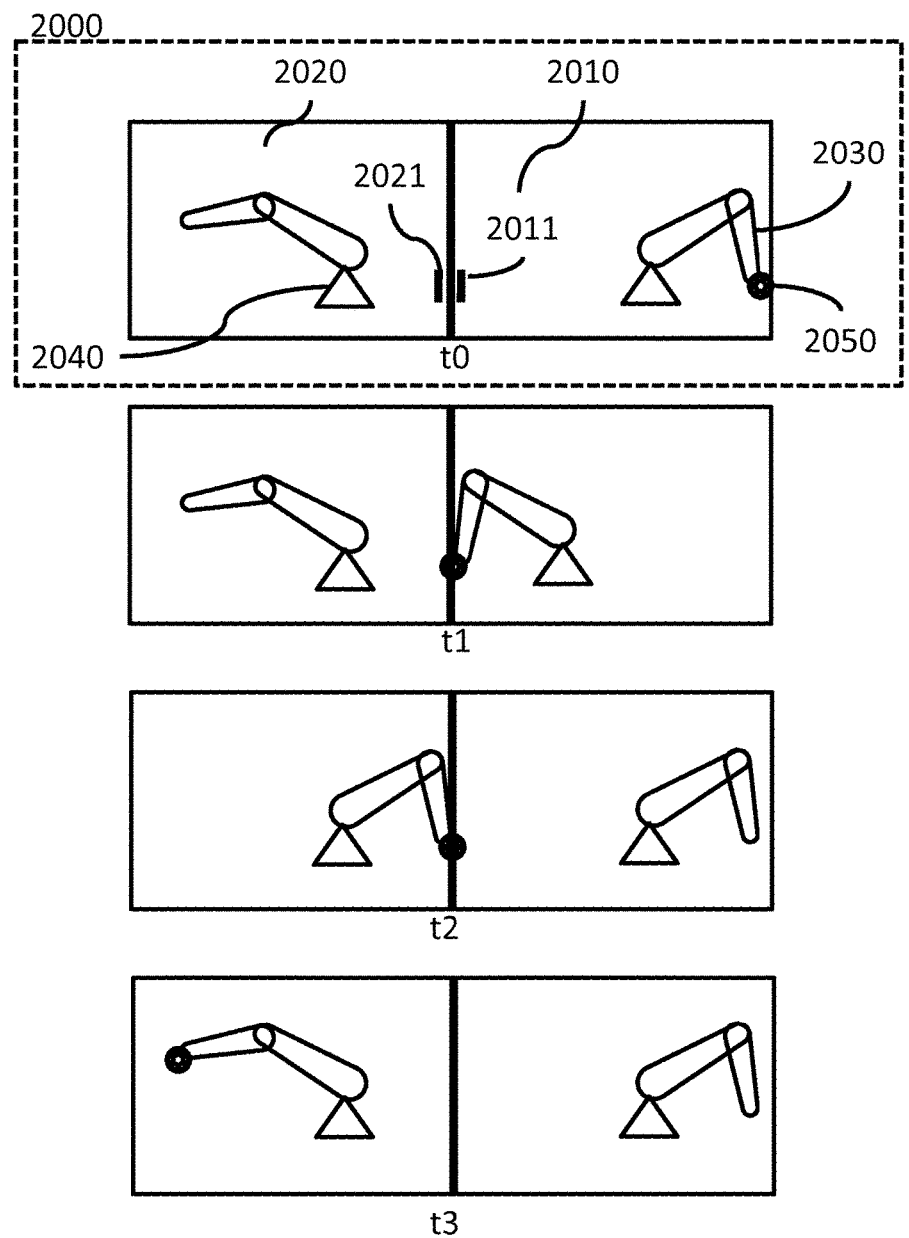
FIG. 20 illustrates an example of a time sequence on how bin load units may be redistributed between a first and a second automated Surface Mount Device (SMD) warehouse in an integrated automated Surface Mount Device (SMD) warehouse cluster.

FIG. 20 illustrates an example of a time sequence on how bin load units may be redistributed between a first and a second automated Surface Mount Device (SMD) warehouse in an integrated automated Surface Mount Device (SMD) warehouse cluster. A first Surface Mount Device (SMD) warehouse 2010 and a second Surface Mount Device (SMD) warehouse are configured to form an integrated automated Surface Mount Device (SMD) warehouse cluster 2000. The first Surface Mount Device (SMD) warehouse 2010 is configured with a first opening 2011 aligning with a second opening 2021 in the second Surface Mount Device (SMD) warehouse 2020, such that bin load units may be redistributed between the first 2010 and the second automated Surface Mount Device (SMD) warehouse 2020 via a first opening 2011 in the first automated Surface Mount Device (SMD) warehouse 2010 and a second opening 2021 in the second automated Surface Mount Device (SMD) warehouse 2020.

At time t0, a first actuator 2030 in the first automated Surface Mount Device (SMD) warehouse 2010 is configured to grip a bin load unit 2050 stored in the first automated Surface Mount Device (SMD) warehouse.

At time t1, the first actuator 2030 transports said bin or bin load unit 2050 to said first opening 2011. Further said first actuator 2030 releases the grip of the bin or bin load 2050 unit in a position where said bin or bin load unit protrudes into said second opening 2021 in said second Surface Mount Device (SMD) warehouse 2020. Alternatively, the first actuator 2030 in the first automated Surface Mount Device (SMD) warehouse 2010 is configured to release the grip of the a bin load unit 2050 in the first opening 2011.

At time t2, a second actuator 2040 in the second automated Surface Mount Device (SMD) warehouse 2020 is configured to grip the bin load unit 2050 protruding into said second opening 2021 in said second Surface Mount Device (SMD) warehouse 2020. Alternatively, the second actuator 2040 in the second automated Surface Mount Device (SMD) warehouse 2020 is configured to grip the bin load unit 2050 in the first opening 2011 such that bin load units can be redistributed from said first Surface Mount Device (SMD) warehouse and said second Surface Mount Device (SMD) warehouse.

At time t3, the second actuator 2040 in the second automated Surface Mount Device (SMD) warehouse 2020 is configured to release the grip and store the bin load unit 2050 in the second automated Surface Mount Device (SMD) warehouse 2020.

In yet another aspect of the technology disclosed describes a method in an automated Surface Mount Device (SMD) warehouse adapted to obtain information related to upcoming SMT jobs, to retrieve bins at predetermined positions within said automated Surface Mount Device (SMD) warehouse, the method comprising:

retrieving said bin at a position within said automated Surface Mount Device (SMD) warehouse;

scanning an identity tag attached to said bin to obtain a bin ID presenting said retrieved bin at a port of said automated Surface Mount Device (SMD) warehouse storing said position and said bin ID In yet another aspect of the technology disclosed, wherein storing is performed to a memory of said automated Surface Mount Device (SMD) warehouse.

In yet another aspect of the technology disclosed, said bins are adapted to comprise bin load units, wherein said bin load unit comprises at least a component tape reel In yet another aspect of the technology disclosed, storing said position and said bin ID further comprises storing said position and said bin ID represented as parameters in a memory of said automated Surface Mount Device (SMD) warehouse In yet another aspect of the technology disclosed, storing said position and said bin ID further comprises storing said position and said bin ID represented as parameters in an SMT information database via a communications network.

In one or more embodiments, wherein said Surface Mount Device (SMD) warehouse and at least a second Surface Mount Device (SMD) warehouse are configured to form an integrated automated Surface Mount Device (SMD) warehouse cluster, wherein bin load units may be redistributed between a first and a second automated Surface Mount Device (SMD) warehouse via a first opening in the automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be redistributed from said first Surface Mount Device (SMD) warehouse and said second Surface Mount Device (SMD) warehouse.

In yet another aspect of the technology disclosed, a bin in a SMT system is adapted to be stored in an automated Surface Mount Device (SMD) warehouse system, said bin comprising:

an identity tag attached to said bin in a predetermined position thereby enabling an actuator comprised in said surface Mount Device (SMD) warehouse to scan said identity tag In yet another aspect of the technology disclosed, an automated Surface Mount Device (SMD) warehouse system is comprising:

an actuator, such as a robot or robotic arm, adapted to retrieve or store bins, pallets or component tape reels at predetermined positions within the automated Surface Mount Device (SMD) warehouse based on control data received from a processor, a memory a processor, adapted to to obtain information related to upcoming SMT jobs, wherein said processor in said automated Surface Mount Device (SMD) warehouse adapted to perform the method steps described herein In yet another aspect of the technology disclosed, an automated Surface Mount Device (SMD) warehouse system comprising:
- an actuator, such as a robot or robotic arm, adapted to retrieve or store bins, pallets or component tape reels at predetermined positions within the automated Surface Mount Device (SMD) warehouse based on control data received from a processor,
- a memory
- a processor, adapted to
- to obtain information related to upcoming SMT jobs, wherein said processor in said automated Surface Mount Device (SMD) warehouse adapted to perform the method steps described herein.

In yet another aspect of the technology disclosed, a computer program product comprising computer readable code configured to, when executed in a processor, perform any or all of the method steps of claims 1-5

In yet another aspect of the technology disclosed, a non-transitory computer readable memory on which is stored computer readable code configured to, when executed in a processor, perform any or all of the method steps described herein In yet another aspect of the technology disclosed, a computer program product comprising computer readable code configured to, when executed in a processor, perform any or all of the method steps of claims 6-9

In yet another aspect of the technology disclosed, a non-transitory computer readable memory on which is stored computer readable code configured to, when executed in a processor, perform any or all of the method steps described herein Pallets in an SMT System When handling of pallets in an SMT system there is a need to ensure that a component tape reel comprised in a palled does not fall out at the same time as an identity tag attached to the component tape reel may be scanned by an operator or actuator in automated Surface Mount Device (SMD) warehouse. In order for the processor in the automated Surface Mount Device (SMD) warehouse to maintain knowledge of the contents of stored bins the identities of component tape reels comprised in the bins are determined.

In one or more aspect of the technology discloses a method in a Surface Mount Technology (SMT) system for a pallet, wherein said pallet is configured with an attached identity tag in a predetermined position, wherein said pallet is adapted to comprise a component tape reel, the method comprising:
- gripping said bin load unit comprised in a bin; and;
- scanning said identity tag;

In yet another aspect of the technology disclosed, wherein gripping and scanning is performed by an actuator comprised in an automated Surface Mount Device (SMD) warehouse In yet another aspect of the technology disclosed, wherein gripping and scanning is performed by an operator of the SMT system A problem when handling component tape reels in an automated Surface Mount Device (SMD) warehouse and in a pick and place machine is that the component tape reels vary in size and therefore requires different receptacle arrangements for different reel sizes. This may be solved by using a pallet configured to handle varying component tape reel sizes. Yet another problem is that the identity label of a component tape reel comprised in a pallet may be difficult or even impossible to scan. Yet another problem identified by the inventors is to retain or comprise a component tape reel in a pallet, while the reel can freely rotate.

In yet another aspect of the technology disclosed, a pallet for use in a Surface Mount Technology (SMT) system, said pallet is comprising a backplane structure adapted to provide support to a component tape reel, said pallet is further adapted to hold or carry a component tape reel by providing a component tape reel retainer structure for keeping or retaining the component tape reel attached to, or contained in, the pallet, said pallet is further configured to provide an opening for enabling the scanning of a barcode on a component tape reel that is attached to, or contained in, the pallet.

A component tape reel is used together with an SMT feeder, when used in operation or production of an SMT pick and place machine. In the present invention, the component tape on a component tape reel is typically threaded in an SMT feeder and the component tape reel identity is associated to the SMT feeder identity in the SMT information database. Handling of components in an SMT system can therefore be improved by storing the component tape reel together with the SMT feeder in automated Surface Mount Device (SMD) warehouse, in particular handling of both in pallets in an SMT system.

In yet another aspect of the technology disclosed, said pallet is further adapted to comprise an SMT feeder for guiding the component tape of a component tape reel attached to, or contained in said pallet to the picking position of a SMT pick-and-place machine.

As an identity tag attached to the component tape reel can be scanned, a retaining arrangement is required.

In yet another aspect of the technology disclosed, said component tape reel structure is further configured to provide retaining support in a Z axis (normal) direction on at least one of a peripheral or close to the center of a component tape reel, and wherein said opening is an opening in said component tape reel retainer structure that is adapted to allow the scanning of an identity tag (arbitrarily placed) barcode on the side of a component tape reel attached to, or contained in, the pallet without blocking the scanning light beam of an pallet-external barcode scanner.

In yet another aspect of the technology disclosed, said component tape reel retainer structure is configured to provide support to a component tape reel contained in the pallet in a Z axis direction opposite the backplane, thereby enabling the pallet to retain a component tape reel attached to, or contained in, the pallet without pallet-external support to the reel when the pallet is positioned in a vertical upright position or upside down with the backside of the backplane facing up.

In yet another aspect of the technology disclosed, said component tape reel retainer structure is providing a structure configured to allow a component tape reel to (freely) rotate while being attached to, or contained in, said pallet.

When handling the component tape reel, a common problem is to avoid that the component tape unwinds from the component tape reel, which leads to unwanted delays in the production of SMT production units in the SMT pick and place machine.

In yet another aspect of the technology disclosed, said component tape reel retainer structure is further providing a structure for retaining a component tape reel in a radial direction and within an essentially fixed volume within said pallet when the component tape reel is rotating while being contained in said pallet.

In yet another aspect of the technology disclosed, said component tape reel retainer structure is comprising at least one of a nave and a reel-peripheral support structure oriented to provide support to a component tape reel at the, or close to, the periphery of a component taper reel attached to, or contained in, said pallet, and wherein said at least one of a nave and a reel-peripheral support structure is configured to provide retaining support for holding a component taper reel while not blocking the scanning of a barcode on the component tape reel attached to, or contained in, said pallet.

In yet another aspect of the technology disclosed, said at least one of nave and reel-peripheral support structure is adapted to retain a component tape reel in at least one of a Z axis (normal) or radial direction.

In yet another aspect of the technology disclosed, wherein the pallet is adapted to prevent radial movement of a component taper reel attached to, or contained in, the pallet by providing holding support for keeping the center point of the component tape reel that is rotating within said pallet at a fixed, or essentially fixed, position also when the component tape reel is rotating within said pallet.

In yet another aspect of the technology disclosed, the pallet is providing component tape reel structure comprising an X axis component tape reel retainer, a Y axis component tape reel retainer and a Z axis component tape reel retainer, wherein said X, Y, Z axis retainers are adapted to allow said component tape reel to rotate within said pallet.

In one or more aspects of the technology disclosed, a Surface Mount Technology (SMT) system for a pallet, wherein said pallet is configured with an attached identity tag in a predetermined position, wherein said pallet is adapted to comprise a component tape reel, the system adapted to perform the method steps described herein.

In yet another aspect of the technology disclosed, a computer program product comprising computer readable code is configured to, when executed in a processor, perform any or all of the method steps described herein In yet another aspect of the technology disclosed, a non-transitory computer readable memory on which is stored computer readable code is configured to, when executed in a processor, perform any or all of the method steps described herein Identifying a Pallet in an SMT System There is a need to be able to scan identity tags of pallets comprised in a bin in an automated Surface Mount Device (SMD) warehouse as well as when inserted in an SMT pick and place machine. This enables automatic scanning of a plurality of pallets comprised in a bin when returning the bin to an automated Surface Mount Device (SMD) warehouse. This also enables manual operator scanning of a plurality of pallets comprised in a bin inserted in an SMT pick and place machine.

In one or more aspect of the technology disclosed a method in a Surface Mount Technology (SMT) system for scanning of a plurality of pallets comprising an identity tag scanner and an SMT information database, wherein said pallet is comprised in and vertically oriented in a bin, wherein said pallet has an pallet identity tag attached to the pallets upwards facing surface, the system configured to perform the steps of:

scanning individual identity tags attached to pallets comprised in said bin to obtain pallet ID's In yet another aspect of the technology disclosed, wherein a pallet of said pallets are comprising at least a component tape reel In yet another aspect of the technology disclosed, wherein scanning is performed by an actuator comprised in an automated Surface Mount Device (SMD) warehouse In yet another aspect of the technology disclosed, a method in a Surface Mount Technology (SMT) system for scanning of a plurality of pallets comprising an identity tag scanner and an SMT information database, wherein said pallet is comprised in and vertically oriented in a bin, wherein said pallet has an pallet identity tag attached to the pallets upwards facing surface, the system configured to perform the steps of:

scanning individual identity tags attached to pallets comprised in said bin to obtain pallet ID's In yet another aspect of the technology disclosed, wherein a pallet of said pallets are comprising at least a component tape reel In yet another aspect of the technology disclosed, wherein scanning is performed by an operator of the SMT system In yet another aspect of the technology disclosed, a pallet for use in a Surface Mount Technology (SMT) system, said pallet is comprising a backplane structure adapted to provide support to a component tape reel attached to, or contained in, said pallet, wherein said pallet is further adapted to hold or carry a component tape reel by providing a component tape reel retainer structure for keeping or retaining the component tape reel attached to, or contained in, the pallet, wherein said pallet is configured with an attached identity tag (in form of a barcode) associating said pallet with an identity, wherein said pallet is adapted to comprise a component tape reel.

In yet another aspect of the technology disclosed, wherein said pallet identity tag is attached to the pallets upwards facing surface when the said pallet is comprised in and vertically oriented in a bin.

In yet another aspect of the technology disclosed, wherein Pallet-ID is a tag in a predetermined (well-defined) position known to a barcode scanner/reading unit.

In yet another aspect of the technology disclosed, wherein Pallet-ID is a tag configured to be scanned from above, known to a barcode scanner and/or robot in a SMT Warehouse In yet another aspect of the technology disclosed, wherein Pallet-ID is a tag that may be easily scanned by an operator when placed in a pick-and-place machine In yet another aspect of the technology disclosed, wherein said pallet is further configured to provide an opening for enabling the scanning of a barcode on a component tape reel that is attached to, or contained in, the pallet.

In yet another aspect of the technology disclosed, wherein said pallet is further adapted to comprise an SMT feeder for guiding the component tape of a component tape reel attached to, or contained in said pallet to the picking position of a SMT pick-and-place machine.

In yet another aspect of the technology disclosed, a computer program product comprising computer readable code configured to, when executed in a processor, perform any or all of the method steps described herein In yet another aspect of the technology disclosed, a non-transitory computer readable memory on which is stored computer readable code configured to, when executed in a processor, perform any or all of the method steps described herein In yet another aspect of the technology disclosed, a computer program product comprising computer readable code configured to, when executed in a processor, perform any or all of the method steps described herein In yet another aspect of the technology disclosed, a non-transitory computer readable memory on which is stored computer readable code configured to, when executed in a processor, perform any or all of the method steps described herein Preventing Unwinding of a Component Reel When a pallet is removed from an SMT pick and place machine the component tape might unwind resulting in complicated handling and manual re-winding of the component tape. It is therefore a need to prevent unwinding of a component tape reel.

In one or more embodiments, a method in a Surface Mount Technology (SMT) system for starting SMT production, wherein said SMT system comprises a pallet and an SMT pick and place machine, wherein said pallet is further adapted to hold or carry a component tape reel by providing a component tape reel retainer structure for keeping or retaining the component tape reel attached to, or contained in, the pallet, wherein said pallet is comprised in and vertically oriented in a bin, the method comprising:

placing a component tape reel in said pallet; and;
starting SMT production of SMT production units in said SMT pick and place machine, wherein starting SMT production at least comprises initiating feeding components from said component tape reel to the SMT pick and place machine.

IN one or more aspect of the technology disclosed, a method in a Surface Mount Technology (SMT) system for preventing unwinding of a component tape comprised on a component tape reel, wherein said SMT system comprises a pallet and an SMT pick and place machine, wherein said pallet is further adapted to hold or carry a component tape reel by providing a component tape reel retainer structure for keeping or retaining the component tape reel attached to, or contained in, the pallet the method comprising:

engaging a friction break upon removal of said pallet from said SMT pick and place machine, hereby preventing unwinding of the tape, e.g. when the reel is no longer feeding components to a pick-and-place machine In yet another aspect of the technology disclosed, a pallet for use in a Surface Mount Technology (SMT) system, said pallet is comprising a backplane structure adapted to provide support to a component tape reel attached to, or contained in, said pallet, wherein said pallet is further adapted to hold or carry a component tape reel by providing a component tape reel retainer structure for keeping or retaining the component tape reel attached to, or contained in, the pallet, said component tape reel retainer structure is comprising at least one of a nave and a reel-peripheral support structure, said reel-peripheral support structure is adapted to provide support to a component tape reel at the, or close to, the periphery of a component taper reel attached to, or contained in, said pallet.

In one or more embodiments, wherein the pallet 1810 further comprising a backplane 1811 and a component tape reel retainer structure in the shape of a box, wherein said box is configured with a bottom 18121, and four side walls 18122 and a slit 1840 configured to allow a component tape on a comprised component tape reel 1820 protrude through the slit.

In yet another aspect of the technology disclosed, wherein said Z axis component tape reel retainer is adapted with a friction brake, thereby preventing unwinding of the tape, e.g. when the reel is no longer feeding components to a pick-and-place machine.

In yet another aspect of the technology disclosed, wherein said Z axis component tape reel retainer is adapted with a friction brake, thereby preventing unwinding of the tape, e.g. when the reel is no longer feeding components to a pick-and-place machine.

In yet another aspect of the technology disclosed, wherein said Z axis component tape reel retainer is adapted with a friction brake, thereby preventing unwinding of the tape, e.g. when the reel is no longer feeding components to a pick-and-place machine.

In yet another aspect of the technology disclosed, wherein said an X-axis component tape reel retainer or a Y-axis component tape reel retainer is adapted with a spring and a seat located in the opposite side of said component tape reel, wherein said spring is biasing said component tape reel against said seat.

In yet another aspect of the technology disclosed, the pallet is further configured to provide an opening for enabling the scanning of a barcode on a component tape reel that is attached to, or contained in, the pallet.

In yet another aspect of the technology disclosed, the pallet is further adapted to comprise an SMT feeder for guiding the component tape of a component tape reel attached to, or contained in said pallet to the picking position of a SMT pick-and-place machine.

In yet another aspect of the technology disclosed, wherein said component tape reel structure is further configured to provide retaining support in a Z axis (normal) direction on at least one of a peripheral or close to the center of a component tape reel, and wherein said opening is an opening in said component tape reel retainer structure that is adapted to allow the scanning of an identity tag (arbitrarily placed) barcode on the side of a component tape reel attached to, or contained in, the pallet without blocking the scanning light beam of an pallet-external barcode scanner.

In yet another aspect of the technology disclosed, said component tape reel retainer structure is configured to provide support to a component tape reel contained in the pallet in a Z axis direction opposite the backplane, thereby enabling the pallet to retain a component tape reel attached to, or contained in, the pallet without pallet-external support to the reel when the pallet is positioned in a vertical upright position or upside down with the backside of the backplane facing up.

In yet another aspect of the technology disclosed, said component tape reel retainer structure is providing a structure configured to allow a component tape reel to (freely) rotate while being attached to, or contained in, said pallet.

In yet another aspect of the technology disclosed, said component tape reel retainer structure is further providing a structure for retaining a component tape reel in a radial direction and within an essentially fixed volume within said pallet when the component tape reel is rotating while being contained in said pallet.

In yet another aspect of the technology disclosed, said component tape reel retainer structure is comprising at least one of a nave and a reel-peripheral support structure oriented to provide support to a component tape reel at the, or close to, the periphery of a component taper reel attached to, or contained in, said pallet, and wherein said at least one of a nave and a reel-peripheral support structure is configured to provide retaining support for holding a component taper reel while not blocking the scanning of a barcode on the component tape reel attached to, or contained in, said pallet.

In yet another aspect of the technology disclosed, said at least one of nave and reel-peripheral support structure is adapted to retain a component tape reel in at least one of a Z axis (normal) or radial direction.

In yet another aspect of the technology disclosed, the pallet is adapted to prevent radial movement of a component taper reel attached to, or contained in, the pallet by providing holding support for keeping the center point of the component tape reel that is rotating within said pallet at a fixed, or essentially fixed, position also when the component tape reel is rotating within said pallet In yet another aspect of the technology disclosed, the pallet is providing component tape reel structure comprising an X axis component tape reel retainer, a Y axis component tape reel retainer and a Z axis component tape reel retainer, wherein said X, Y, Z axis retainers are adapted to allow said component tape reel to rotate within said pallet In yet another aspect of the technology disclosed, it is described a Surface Mount Technology (SMT) pallet for preventing unwinding of a component tape comprised on a component tape reel, wherein said SMT system comprises a pallet and an SMT pick and place machine, wherein said pallet is further adapted to hold or carry a component tape reel by providing a component tape reel retainer structure for keeping or retaining the component tape reel attached to, or contained in, the pallet adapted to perform the step:

engaging a friction break upon removal of said pallet from said SMT pick and place machine, hereby preventing unwinding of the tape, e.g. when the reel is no longer feeding components to a pick-and-place machine.

Figure 12A:
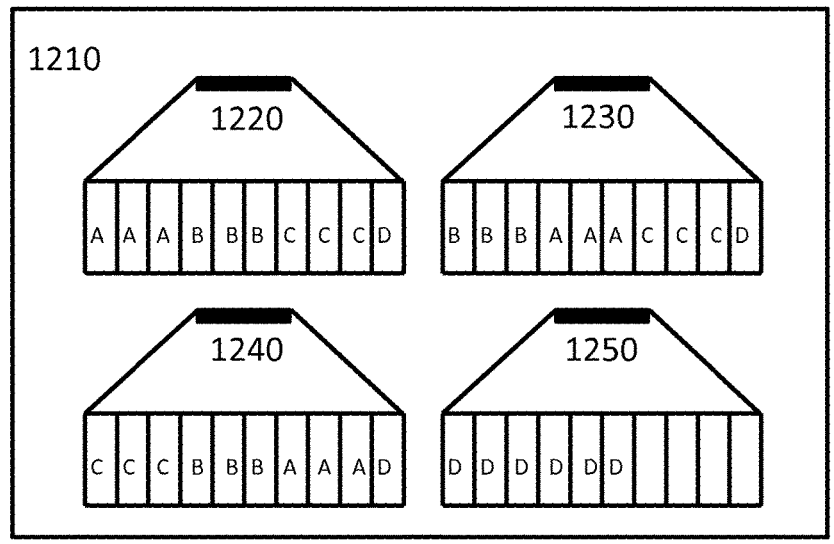
FIG. 12a and FIG. 12b shows schematically how bin loading units are redistributed between two or more stored bins in the automated Surface Mount Device (SMD) warehouse, e.g. based on component requirements of upcoming SMT jobs.
Figure 12B:
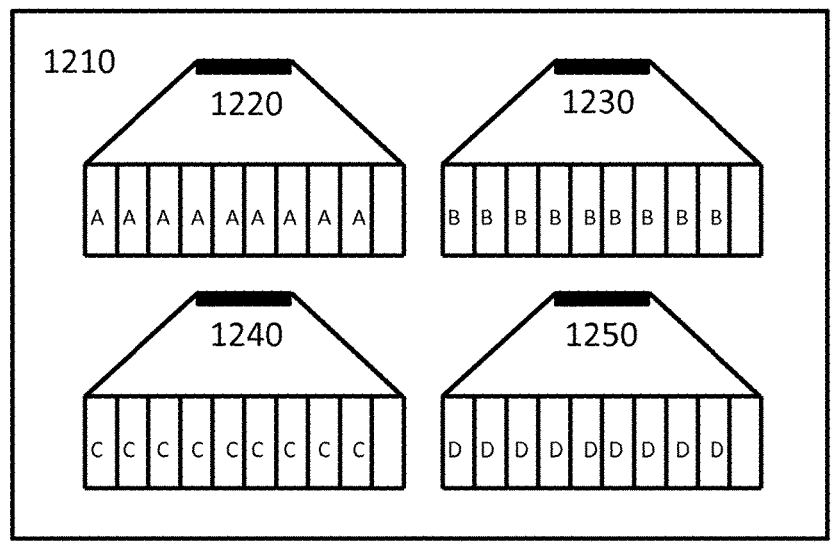

FIGS. 12a and 12b shows schematically how in an embodiment bin loading units, denoted by letters A-D in the figure, are redistributed between two or more stored bins in the automated Surface Mount Device (SMD) warehouse, e.g. based on component requirements of upcoming SMT jobs. In one example FIG. 12b illustrates how bins 1220-1250 are pre-loaded based on the component requirements of upcoming SMT jobs, e.g. job A, job B, job C and job D.

Figure 13:
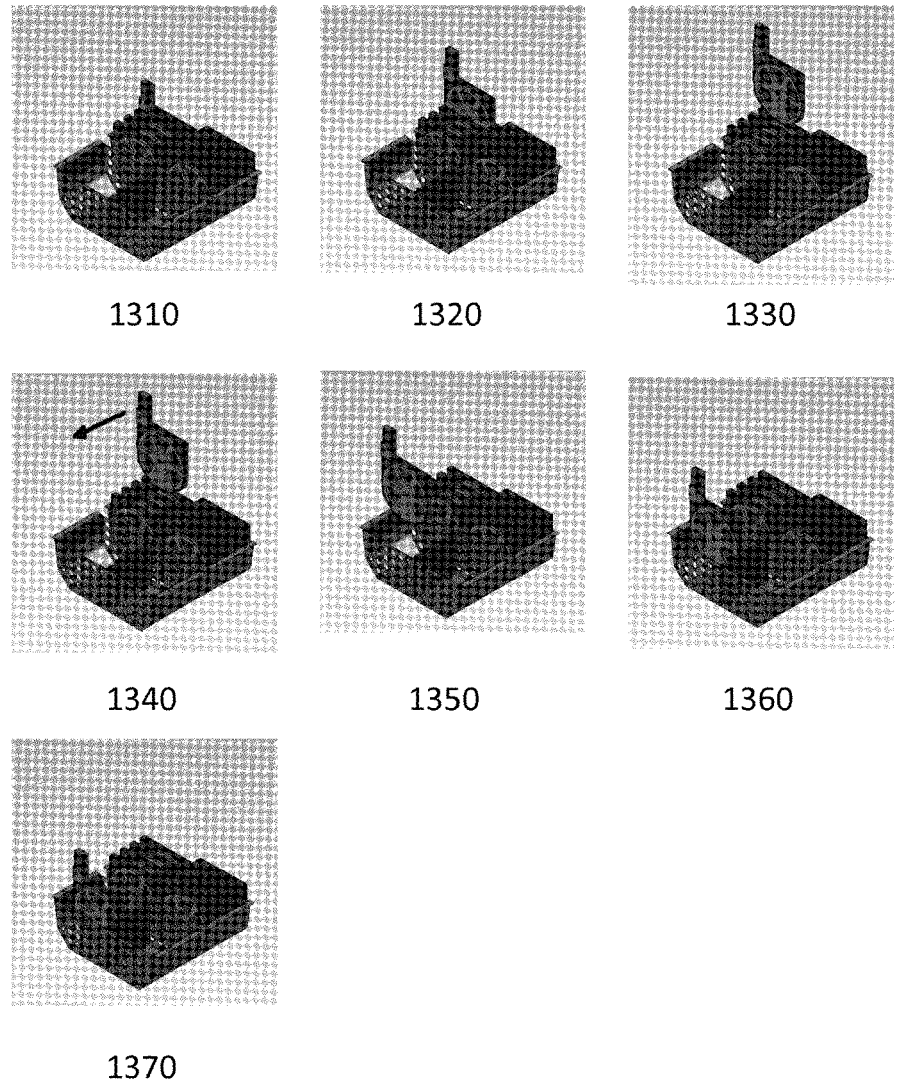
FIG. 13 shows schematically how bin loading units may be redistributed between two or more stored bins in the automated Surface Mount Device (SMD) warehouse, e.g. by being brought to a designated intermediate redistribution area where bin load units might be redistributed.

FIG. 13 shows schematically how bin loading units may be redistributed between two or more stored bins in the automated Surface Mount Device (SMD) warehouse, e.g. by being brought to a designated intermediate redistribution area where bin load units might be redistributed. The actuator or robotic arm of the automated Surface Mount Device (SMD) warehouse grips a load unit in a first bin and moves to a compartment in a second bin, illustrated by the image sequence 1310-1370.

Figure 14A:
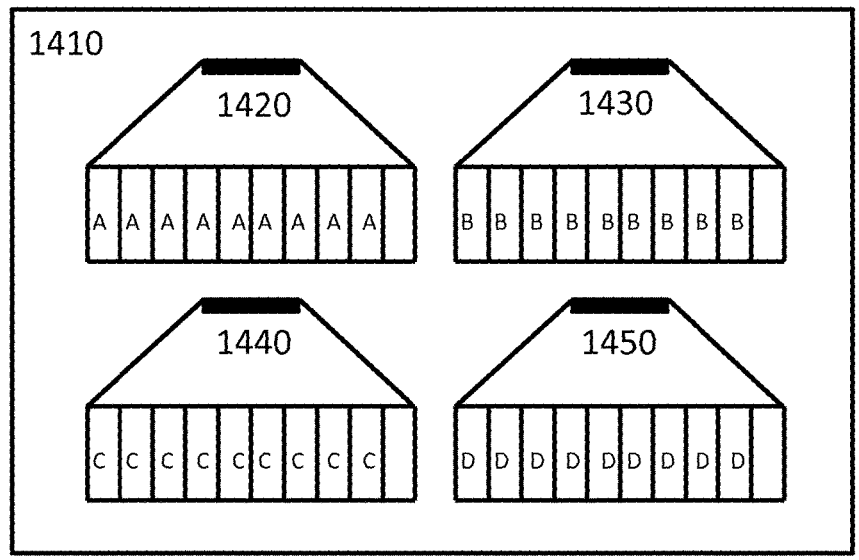
FIGS. 14a and 14b shows schematically how bins are redistributed between positions in the automated Surface Mount Device (SMD) warehouse, e.g. based on component requirements of upcoming SMT jobs.
Figure 14B:
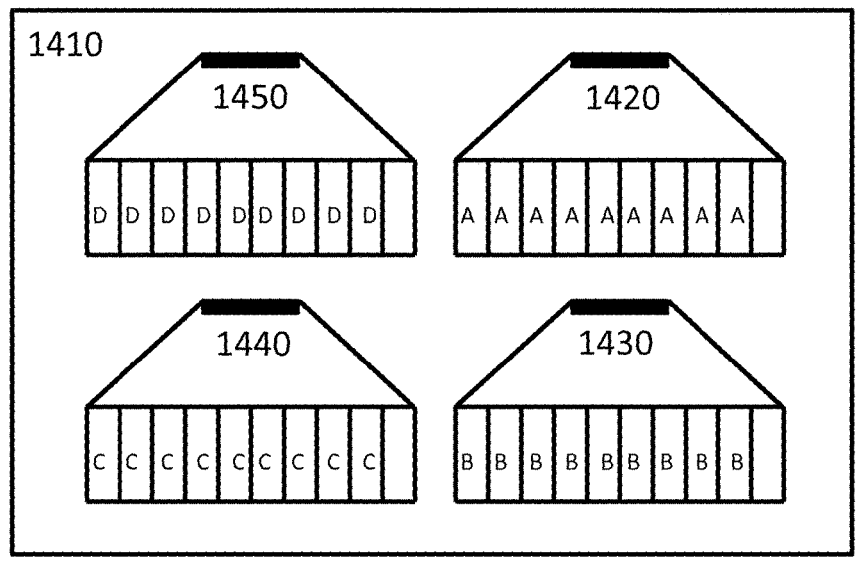

FIGS. 14a and 14b shows schematically how bins may be redistributed between positions in the automated Surface Mount Device (SMD) warehouse based on component requirements of upcoming SMT jobs. In one example, a SMT job list or sequence of job D, job a, job C and job D are to be performed and by redistributing the bins the retrieval time for the bin pre-loaded for SMT job D can be reduced as the distance to the port is reduced.

Figure 16:
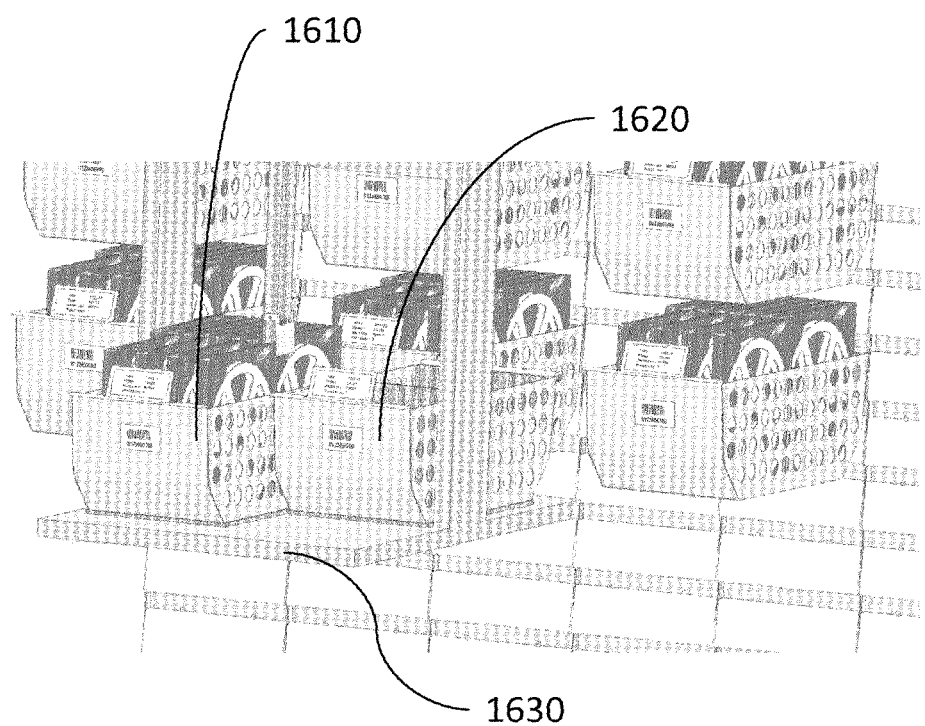
FIG. 16 shows schematically how bin load units are automatically redistributed between positions in the automated Surface Mount Device (SMD) warehouse using a table.

FIG. 16 shows schematically how bin load units is automatically redistributed between positions in the automated Surface Mount Device (SMD) warehouse using a table 1630. A first stored bin 1610 is retrieved to a table attached to an actuator comprised in said automated Surface Mount Device (SMD) warehouse and said actuator is moved to a position of a second stored bin 1620 within said automated Surface Mount Device (SMD) warehouse. In yet an embodiment the second bin 1620 is retrieved to the table 1630. In yet another embodiment, bin load units is automatically redistributed between positions in the automated Surface Mount Device (SMD) warehouse using a table by redistributing bin load units from said first bin 1610 to said second bin 1620.

Figure 17A:
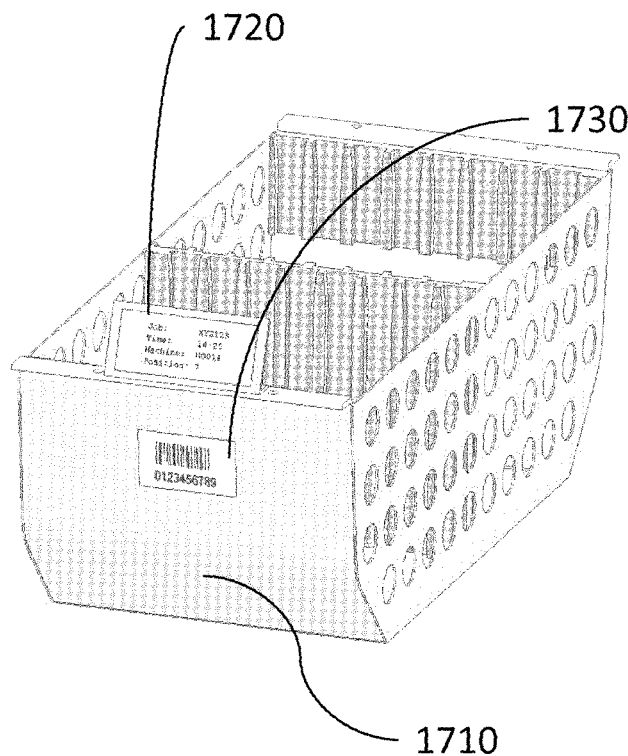
FIG. 17a shows an embodiment of the invention, wherein a bin 1710. is configured with an alphanumerical display 120 with an integrated alphanumerical display controller and an identity tag attached 1730 to said bin such that a bin ID can be obtained.

FIG. 17a shows an embodiment of the invention, wherein a bin 1710. is configured with an alphanumerical display 1720 with an integrated alphanumerical display controller and an identity tag attached 1730 to said bin such that a bin ID can be obtained. IN one example, this identity tag is a bar code.

Figure 17B:
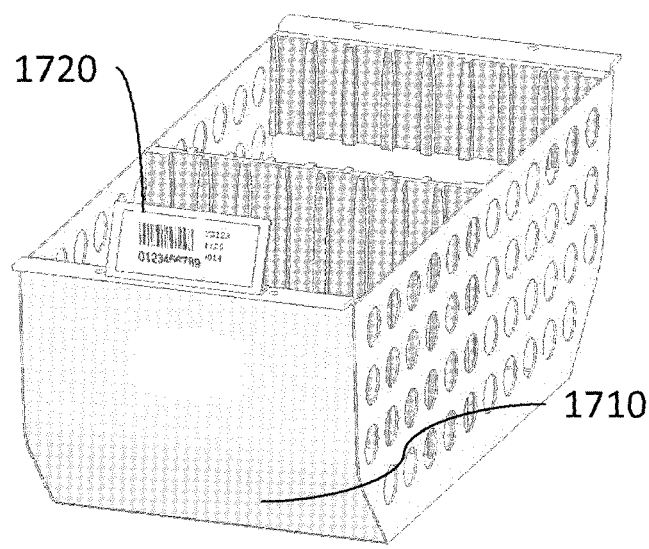
FIG. 17b shows yet an embodiment of the invention, wherein a bin 1710. is configured with an alphanumerical display 120 with an integrated alphanumerical display controller, wherein display data comprises a bin ID.

FIG. 17b shows yet an embodiment of the invention, wherein a bin 1710. is configured with an alphanumerical display 1720 with an integrated alphanumerical display controller, wherein display data comprises a bin ID, wherein said bin ID is presented as a bar code, QR code or the like. Thus, the alphanumerical display 1720 will function as well as an identity tag of the bin. In one or more embodiment the communications network ID of the alphanumerical display 1720, used to send data to and receive data from the alphanumerical display controller, is identical to the bin ID.

Figure 18:
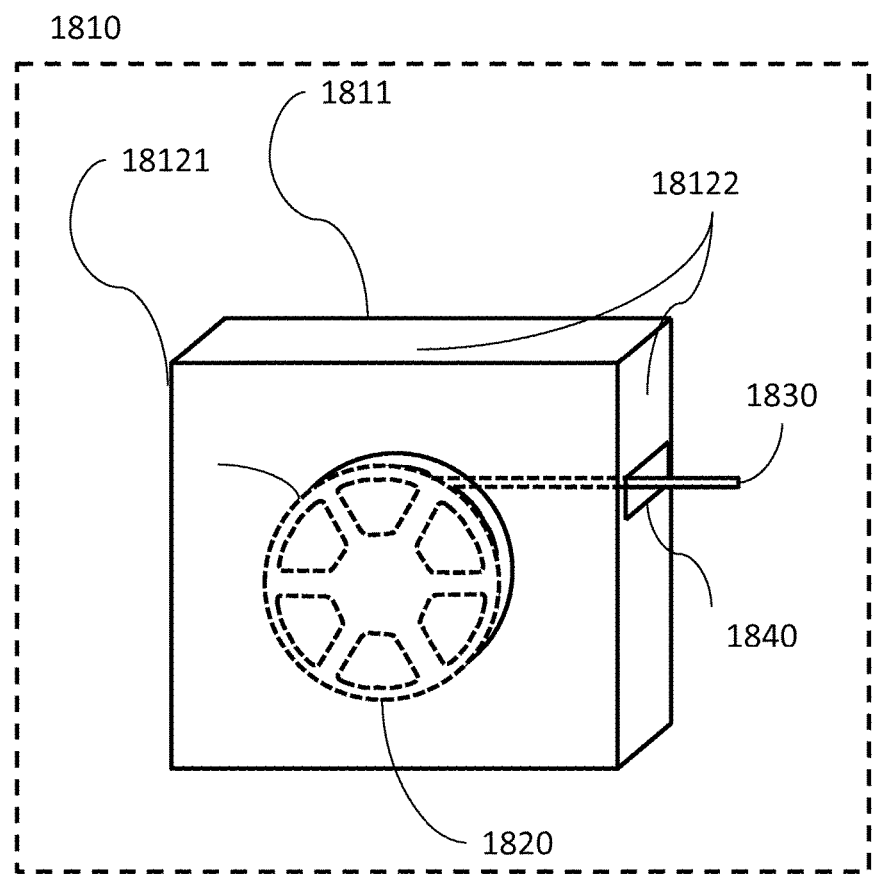
FIG. 18 shows an embodiment of a pallet, wherein the pallet comprises a backplane and a component tape reel retainer structure in the shape of a box.

FIG. 18 shows an embodiment of a pallet 1810, wherein the pallet 1810 comprises a backplane 1811 and a component tape reel retainer structure in the shape of a box, wherein said box is configured with a bottom 18121, and four side walls 18122 and a slit 1840 configured to allow a component tape on a comprised component tape reel 1820 protrude through the slit. In one or more embodiment, the pallet further comprises a friction break configured to engage upon removal of said pallet from said SMT pick and place machine, hereby preventing unwinding of the tape when the reel is no longer feeding components to a pick-and-place machine.

To pre-load the bins to optimize or prepare for presentation at a port of the automated Surface Mount Device (SMD) warehouse based on upcoming SMT jobs, thereby make sure the components required for production of an SMT production unit is present when the bin is presented, the bin load units are redistributed within the same bin or between two or more different bins. The advantage is that bins can be pre-loaded for upcoming SMT jobs, the retrieval time in the tower can be reduced by placing bins required for the next upcoming SMT job close to the port and certain components can be distributed in different automated Surface Mount Device (SMD) warehouses.

In some embodiments, the bins might comprise pallets that in turn comprise component tape reels and optionally a matching SMT feeder.

Figure 8A:
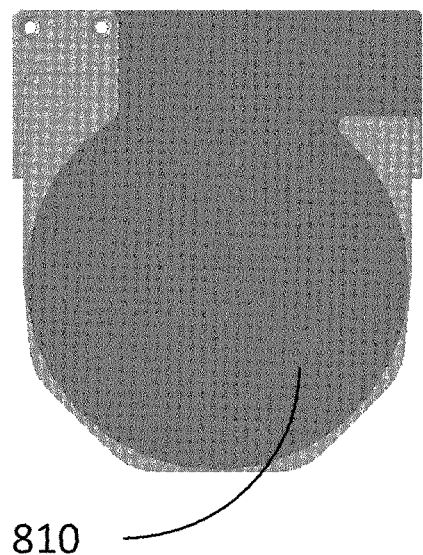
FIG. 8a shows an example of a pallet.

FIG. 8a shows an example of a pallet 810.

Figure 8B:
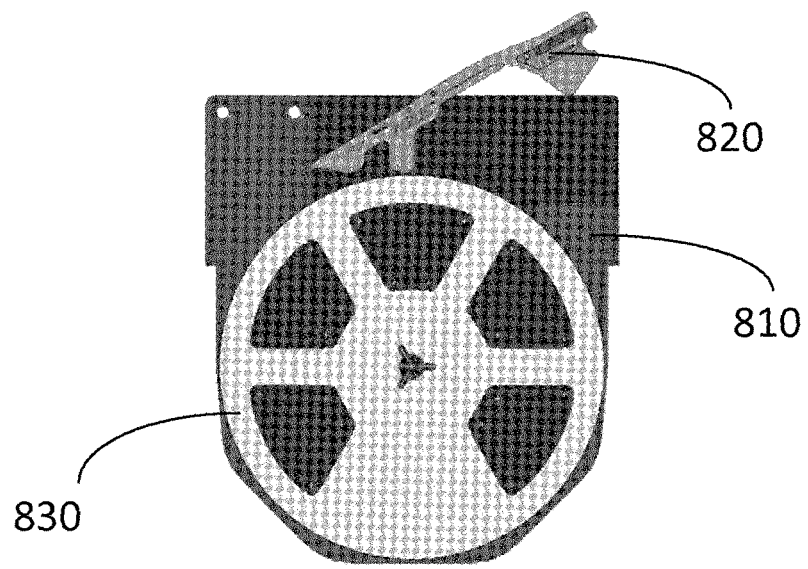
FIG. 8b shows an example of a pallet comprising a component tape reel and an SMT feeder.

FIG. 8b shows an example of a pallet 810 comprising a component tape reel 830 and an SMT feeder 820.

Figure 9:
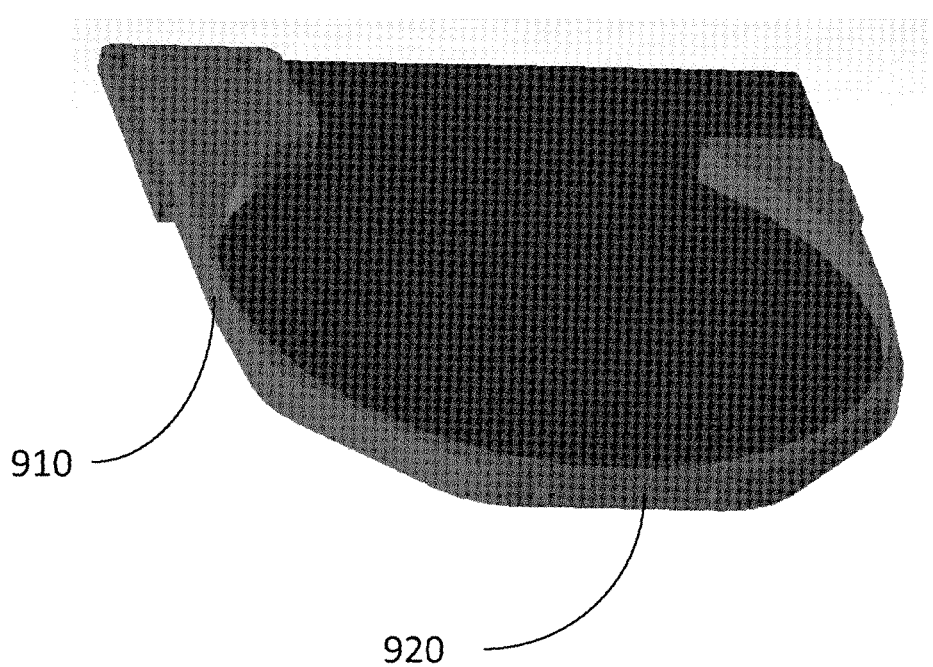
FIG. 9 shows an example of a pallet adapted with an X axis component tape reel retainer and a Y axis component tape reel retainer, wherein said X, Y, Z axis retainers are adapted to allow said component tape reel rotate.
Figure 10A:
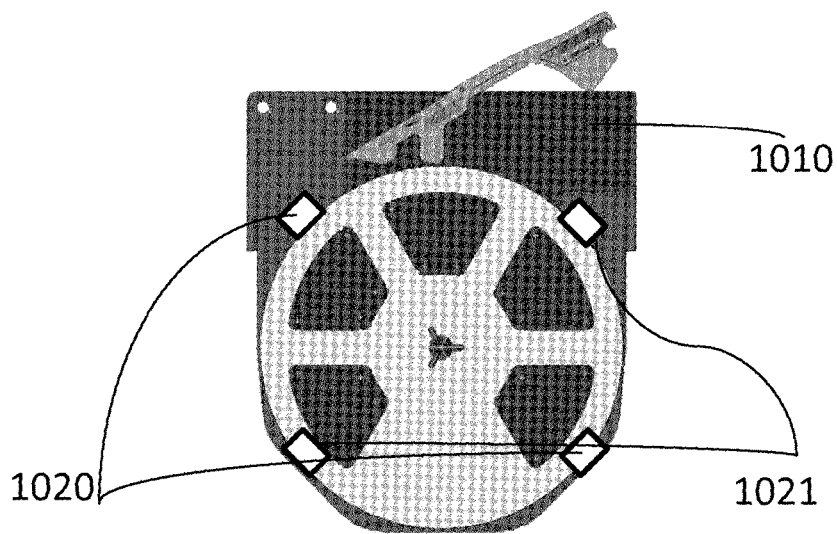
FIG. 10a shows an example of a pallet adapted with a Z-axis component tape reel retainer, wherein the Z-axis component tape reel retainer comprises a backplane and a peripheral Z-axis component tape reel retainer.

FIG. 9 shows an example of a pallet, wherein said pallet is adapted to comprise a backplane and, an X axis component tape reel retainer and a Y axis component tape reel retainer wherein said X, Y axis retainers are adapted to allow said component tape reel to rotate. The retainers restricts movement of a comprised component tape reel along the X axis and Y axis FIG. 10a shows an example of a pallet, wherein said pallet is adapted to comprise a backplane 1010, a combined reel-peripheral support structure in the form of an X axis component tape reel retainer 1020, a Y axis component tape reel retainer 1020 and a Z axis component tape reel retainer 1020, wherein said X, Y, Z axis retainers are adapted to allow said component tape reel rotate. The retainers restrict movement of a comprised component tape reel along the X-axis, Y-axis and Z-axis.

Figure 10B:
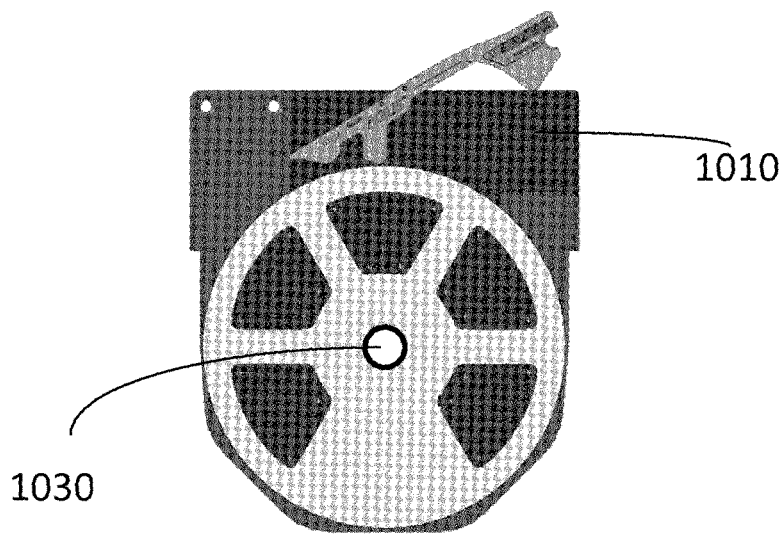
FIG. 10b shows an example of a pallet adapted with a Z-axis component tape reel retainer, wherein the Z-axis component tape reel retainer comprises a backplane and a central Z-axis component tape reel retainer.

FIG. 10b shows yet an example embodiment of the invention, wherein said Z-axis component tape reel retainer comprises a backplane and a nave or central Z-axis component tape reel retainer 1030. In yet another aspect of the technology disclosed said Z-axis component tape reel retainer comprises a backplane and a central Z-axis component tape reel retainer.

In some aspect of the technology disclosed the bin might be adapted with an alphanumerical display controller that is adapted to receive display data by wired or wireless communication, wherein the data might be relating to an upcoming SMT job and displayed to the operator, e.g. the position at the pick and place machine where the bin should be inserted, time or date, the number of remaining components remaining in the bin, an alert to replace the bin or manually refill the bin with bin load units or other alarm conditions relating to production of SMT production units.

The information, e.g. component requirements, used to pre-load bins and presenting bins at a port of the automated Surface Mount Device (SMD) warehouse might be entered by the operator via a input/output device comprised in the automated Surface Mount Device (SMD) warehouse or obtained from the SMT information database, either actively retrieved by request/reply or pushed from the SMT information database or other node connected to the communication network.

When the automated Surface Mount Device (SMD) warehouse receives a bin the processor comprised in the automated Surface Mount Device (SMD) warehouse stores the position where the bin is stored to a memory, e.g. comprised in automated Surface Mount Device (SMD) warehouse.

The automated Surface Mount Device (SMD) warehouse comprises one or several actuators, such as a robot, robot arm or other actuator, as would be understood by a person skilled in the art, that are able to redistribute bins or bin load units within the automated Surface Mount Device (SMD) warehouse or between connected automated Surface Mount Device (SMD) warehouses.

In some aspect of the technology, disclosed bins might be brought to a designated intermediate redistribution area where bin load units might be redistributed within or between two or more bins.

In some aspect of the technology disclosed more than one actuator might be comprised in the automated Surface Mount Device (SMD) warehouse, thereby enabling insertion in fully loaded bins, e.g. by first removing a first bin load unit with a first actuator and fill the empty position in the same bin with another bin unit by a second actuator, much similar how a human being would redistribute bin load units between bins. Obviously, the process might involve one two or several bins until the redistribution is complete.

Figure 4:
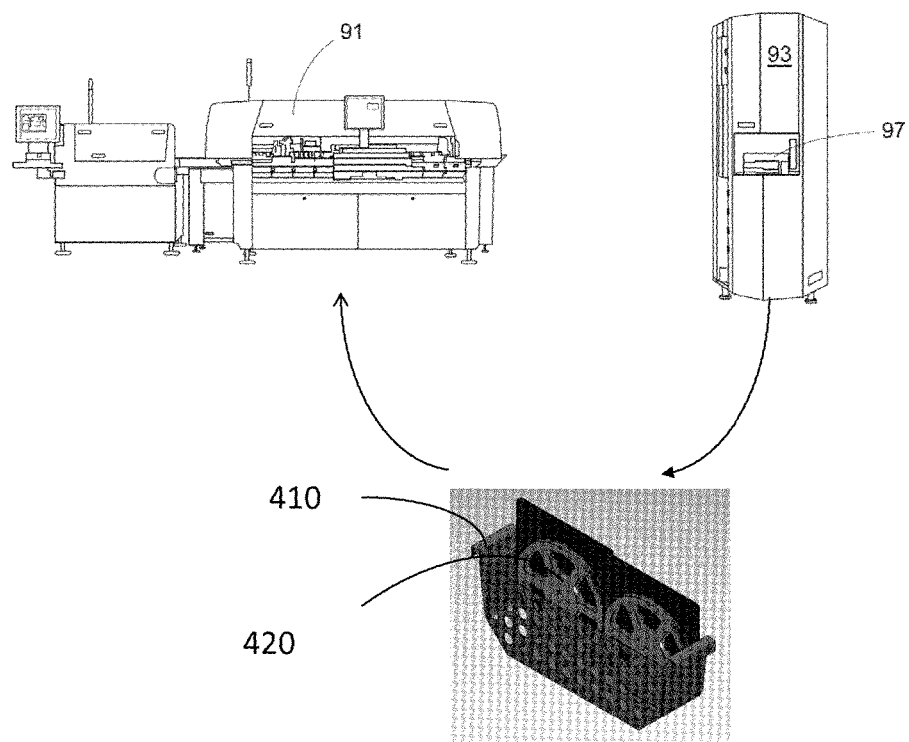
FIG. 4 shows an example of the technology disclosed where bins which are pre-loaded based on upcoming SMT jobs are retrieved at an automated surface mount device (SMD) warehouse and inserted into a component feeding position of the SMT pick and place machine.

As one of the key features of the invention is that pre-loaded bins are provided at the port of the automated Surface Mount Device (SMD) warehouse according to information relating to an upcoming SMT job FIG. 4 shows an aspect of the technology disclosed of a method in a Surface Mount Technology (SMT) system comprising an automated Surface Mount Device (SMD) warehouse 93, an SMT information database and a SMT pick and place machine 91, the method comprising:
  receiving input data;
  retrieving a bin based on said input data and a parameter representing a position within said automated Surface Mount Device (SMD) warehouse, wherein said bin 410 is adapted to comprise bin load units 420, wherein said bin load unit comprises at least a component tape reel.
  presenting said retrieved bin at a port 97 of said automated Surface Mount Device (SMD) warehouse;
  load said bin 410 in said SMT pick and place machine 91

Figure 5:
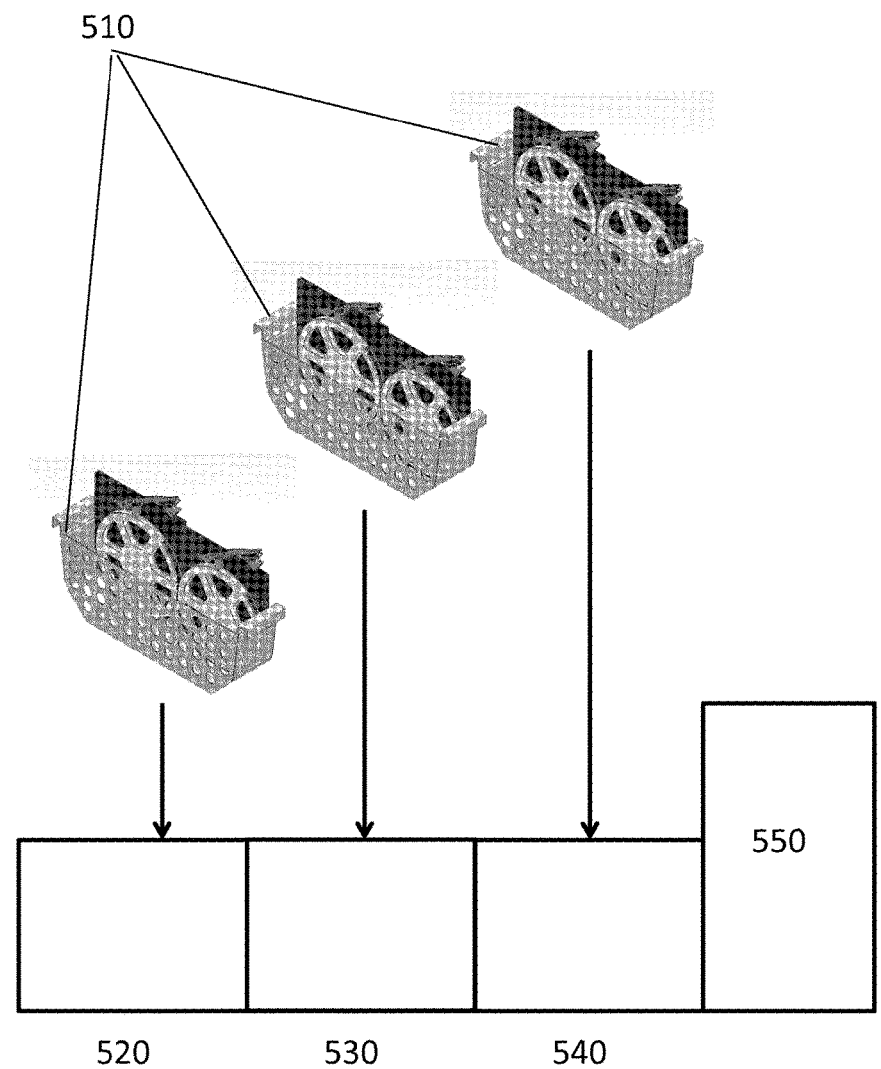
FIG. 5 shows an example where bins that are pre-loaded based on upcoming SMT jobs are inserted into a component feeding position of the SMT pick and place machine.

FIG. 5 shows a schematic view of pre-loaded bins 510, e.g. pre-loaded based on component requirements of an upcoming SMT job, being inserted or loaded into component feeding positions 520, 530 and 540 of the pick and place machine 550.

Use Case Embodiments

The inventors have realized that with the rising complexity of SMT production comes a greater need for quality data. High part number count, a wide variety of boards, and an ever-changing productions schedule are constant challenges that require improved system support and control of information handling. Through embodiments presented herein, there is achieved efficiency and service level from a customer or operator point of view, in the performing any or all of the steps of planning, associating, loading, replenishing and/or unloading as part of an SMT production process.

FIGS. 19a-d show schematically how planning, associating, loading, replenishment and unloading may be performed in accordance with a use case example of a typical workflow in a SMT system.

A planning user starts the workflow by planning an SMT job to be executed and stores said SMT job in an SMT information database. In a use case example referring to FIG. 19a, a planning operator uses an SMT planning tool, e.g. a graphical user interface of a computer program that is adapted to help the user optimize the job sequence and changeover strategy for incoming orders to plan an SMT job. The outcome of the planning is typically a bill of materials 1910, in this disclosure also referred to as SMT job data. The bill of material/SMT job data is sent to the automated SMD warehouse 1912, for example corresponding to any of the SMD warehouse 93, 200 of the attached figures. In response to receiving the bill of materials/SMT job data, the automated SMD warehouse automatically delivers bin load units 1914, e.g. in the form of any of the bin load units 420, 620, 630, 640, 650, 720 of the attached figures. In this use case example, the bin load units 1914 are in the form of component tape reels. Typically, the bin load units delivered from the automated SMD warehouse are already in the correct order for loading into bins. An SMT operator, i.e. a human being or alternatively a robot, then retrieves the bin load units that are delivered from said automated Surface Mount Device (SMD) warehouse, and possibly also substrates from separate storage or from said automated Surface Mount Device (SMD) warehouse. In the use case example, the SMT operator retrieves component tape reels from the automated SMD warehouse 1912 and prepares the component tape reels for loading into the pick and place machine 1924. In order to be able to trace the component tape reels, the preparations include a step of associating the ID of each component tape reel with the ID of a feeder 1919. The SMT operator performs this association by scanning each component tape reel and a corresponding feeder using an identity tag scanner 1918. Through scanning of the unique IDs, the SMT system records the movement of the scanned components. Thereby, components are automatically traced. When the bin load units have been associated with the feeders, the SMT operator places the one or more associated component pairs into a bin 1920. The bin may e.g. correspond to any of the bins 410, 510, 610 or 710 of the attached figures. When a bin is ready, the SMT operator places/loads it in the pick and place machine 1924. The pick and place machine may correspond to any of the pick and place machines 91, 550 of the attached figures.

Figure 19A:
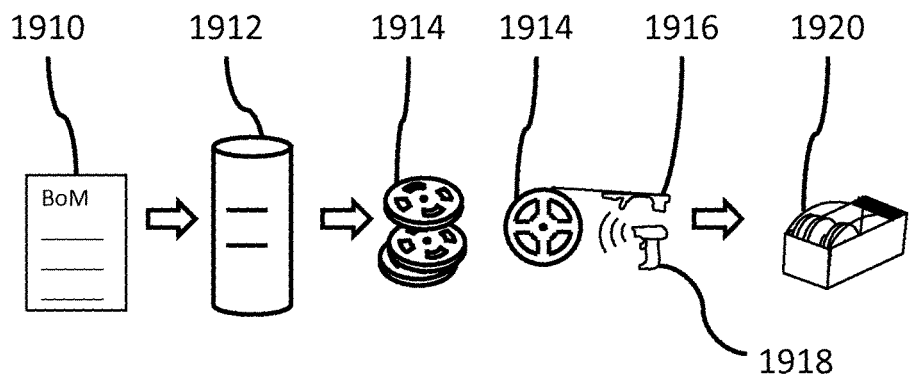
FIGS. 19a-d show schematically how planning, associating, loading, replenishment and unloading may be performed in accordance with a use case example of a typical workflow in a SMT system.
Figure 19B:
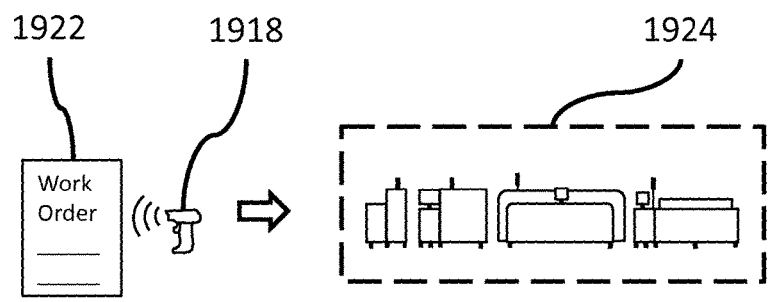

In order for the pick and place machine to know which settings are to be used, SMT job data from the planning step is provided to the pick and place machine, either directly from the planning tool or by the SMT operator scanning the bar code of a work order 1922, using a scanner 1918, comprising the required information/SMT job data. This is illustrated in FIG. 19b. Based on the input SMT job data, machine programs are selected automatically, as are conveyor width and loader/unloader settings. In other words, loading into the pick and place machine is fast and easy for the SMT operator as it requires no manual data entry—just one or two scans of bar codes or other identifiers. As soon as the line is up and running, the SMT operator is free to start preparing the next SMT job. Also, as all bins and feeders are given a unique ID, the SMT operator can check quantity, location, MSD data and batch codes, for a single component or a complete component list for an SMT job, at any point during production.

Figure 19C:
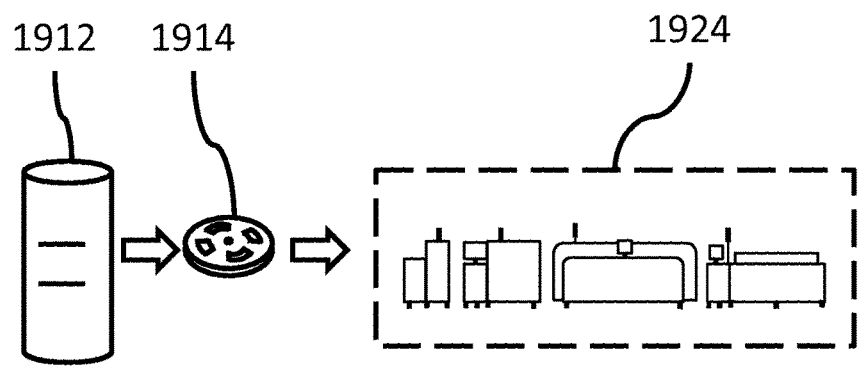

If, at any time, components are about to run out, the machine alerts the operator, re-optimizes and continues mounting other components. The SMT operator that notices such an alert may e.g. press a "provide" button or the like, whereby the SMD warehouse 1912 immediately delivers the requested component/components 1914 for the SMT operator to retrieve, associate and load into the pick and place machine 1924 to replenish the machine. This is illustrated in FIG. 19c. Advanced SMT system of today, such as the system embodiments described herein, may also have a plug-and-play simplicity, which means that the SMT operator can load and unload bins in seconds, saving countless hours of operator time. Specially designed software automatically recognizes the presence, absence and location of components, which means that there is no need to program pick positions and production doesn't stop if a bin has runs out of parts.

Figure 19D:
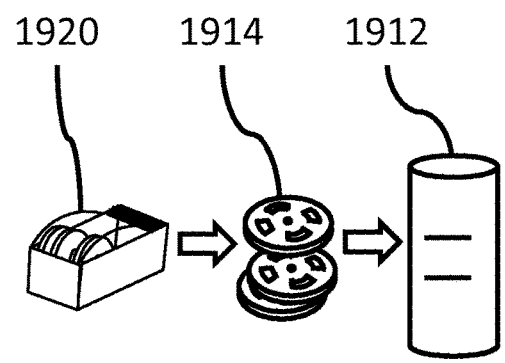

As illustrated in FIG. 19d, when an SMT job is done, or when the work day ends, the SMT operator unloads the bins 1920 from the pick and place machine, removes the component tape reels 1914 from the bin and places them back into an SMD warehouse 1912, that can be the same as the one from where the components where retrieved or a different one. As each component has its one identifier, the system keeps track of the components and mix-ups are avoided.

Embodiments of the invention may improve parts or all of the SMT production workflow, as further described herein.

Advantages of the Invention

The present invention relates to handling of components in an SMT system, in particular identifying a bin in an automated storage unit, thereby allowing association of a bin and comprised bin load units, either when returning a bin to the automated Surface Mount Device (SMD) warehouse or when retrieving a bin from automated Surface Mount Device (SMD) warehouse for an upcoming SMT job in an SMT pick and place machine.

Itemized Embodiments of the Invention

An embodiment 1 including a method in an automated Surface Mount Device (SMD) warehouse configured to store bins at predetermined positions within said automated Surface Mount Device (SMD) warehouse, said automated SMD warehouse comprising at least one actuator, such as a robot or robotic arm, configured to automatically handling objects within said automated Surface Mount Device (SMD) warehouse, the method comprising:
  receiving a bin or trolley at a port of said automated Surface Mount Device (SMD) warehouse;
  scanning an identity tag attached to said bin to obtain a bin ID, or trolley ID.

An embodiment 2 including the method of embodiment 1, further comprising:
  storing, by the use of said at least one actuator, said bin or trolley at a position within said automated Surface Mount Device (SMD) warehouse.

An embodiment 3 including method of any of the embodiments 1 or 2, further comprising:
  storing said position and said bin ID in a memory of said automated Surface Mount Device (SMD) warehouse.

An embodiment 4 including the method of embodiment 1, further comprising:
  presenting, by the use of said at least one actuator, a retrieved bin at or trolley a port of said automated Surface Mount Device (SMD) warehouse.

An embodiment 5 including the method of embodiment 2, wherein said automated Surface Mount Device (SMD) warehouse is a first automated SMD warehouse part of an integrated automated Surface Mount Device (SMD) warehouse cluster, wherein storing said bin further comprise redistributing said bin or trolley, by the use of said at least one actuator, from said first automated Surface Mount Device (SMD) warehouse to a second automated Surface Mount Device (SMD) warehouse comprised in said integrated automated Surface Mount Device (SMD) warehouse cluster.

An embodiment 6 including the method of embodiment 1, wherein said automated Surface Mount Device (SMD) warehouse is part of an integrated automated Surface Mount Device (SMD) warehouse cluster, wherein retrieving said bin further comprise redistributing said bin or trolley from a second automated Surface Mount Device (SMD) warehouse comprised in said integrated automated Surface Mount Device (SMD) warehouse cluster to said automated Surface Mount Device (SMD) warehouse.

An embodiment 7 including the method of embodiment 1, wherein said bins or trolleys are adapted to comprise bin load units, wherein said bin load unit comprises at least a component tape reel.

An embodiment 8 including the method of embodiment 3, wherein storing said position and said bin ID further comprises storing said position and said bin ID represented as parameters, such as a table, in a memory of said automated Surface Mount Device (SMD) warehouse.

An embodiment 9 including the method of embodiment 3, wherein storing said position and said bin ID further comprises storing said position and said bin ID represented as parameters, such as a table, in an SMT information database via a communications network.

An embodiment 10 including the method of embodiment 1, wherein scanning comprises scanning an optically scanned code such as a bar code, QR code or the like, wherein the optically scanned code is presented on a printed label or an alphanumerical display.

An embodiment 11 including the method of embodiment 1, wherein said Surface Mount Device (SMD) warehouse and at least a second Surface Mount Device (SMD) warehouse are configured to form an integrated automated Surface Mount Device (SMD) warehouse cluster, wherein bin load units may be redistributed between a first and a second automated Surface Mount Device (SMD) warehouse via a first opening in the automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be redistributed from said first Surface Mount Device (SMD) warehouse and said second Surface Mount Device (SMD) warehouse.

An embodiment 12 including a method in an automated Surface Mount Device (SMD) warehouse adapted to obtain information related to upcoming SMT jobs, to retrieve bins or trolleys at predetermined positions within said automated Surface Mount Device (SMD) warehouse, said automated SMD warehouse comprising at least one actuator, such as a robot or robotic arm, configured to automatically handling objects within said automated Surface Mount Device (SMD) warehouse, the method comprising:
  retrieving, by the use of said at least one actuator, said bin or trolley at a position within said automated Surface Mount Device (SMD) warehouse;
  scanning an identity tag attached to said bin to obtain a bin ID, or trolley ID;
  presenting, by the use of said at least one actuator, said retrieved bin or trolley at a port of said automated Surface Mount Device (SMD) warehouse; and
  storing said position and said bin ID, or trolley ID, in a memory of said automated Surface Mount Device (SMD) warehouse.

An embodiment 13 including the method of embodiment 12, wherein said bins are configured to comprise bin load units, wherein said bin load unit comprises or constitutes a component tape reel.

An embodiment 14 including the method of embodiment 12, wherein storing said position and said bin ID, or trolley ID, further comprises storing said position and said bin ID, or trolley ID, represented as parameters in a memory of said automated Surface Mount Device (SMD) warehouse.

An embodiment 15 including the method of embodiment 12, wherein storing said position and said bin ID, or trolley ID, further comprises storing said position and said bin ID, or trolley ID, represented as parameters in an SMT information database via a network such as a communications network.

An embodiment 16 including the method of embodiment 12, wherein said Surface Mount Device (SMD) warehouse and at least a second Surface Mount Device (SMD) warehouse are configured to form an integrated automated Surface Mount Device (SMD) warehouse cluster, wherein bin load units may be redistributed between a first and a second automated Surface Mount Device (SMD) warehouse via a first opening in the automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be redistributed from said first Surface Mount Device (SMD) warehouse and said second Surface Mount Device (SMD) warehouse.

An embodiment 17 including bin for use in a SMT system, said bin being configured to be loaded with a plurality of bin load units and is further adapted to be stored in an automated Surface Mount Device (SMD) warehouse system, said bin comprising:
  an identity tag attached to said bin in a predetermined position.

An embodiment 18 including the bin of claim 17, wherein said predetermined position is chosen to enable a scanner or reader unit comprised in said Surface Mount Device (SMD) warehouse to automatically scan or read said identity tag.

An embodiment 19 including an automated Surface Mount Device (SMD) warehouse for storing or retrieving bins comprising:
  an actuator, such as a robot or robotic arm, adapted to scan an identity tag attached to a bin, to obtain a bin ID, retrieve or store bins at predetermined positions within the automated Surface Mount Device (SMD) warehouse based on control data received from a processor,
  a memory
  a processor, adapted to scanning an identity tag attached to said bin to obtain a bin ID.

An embodiment 20 including the method of embodiment the automated SMD warehouse of claim 19, wherein said processor in said automated Surface Mount Device (SMD) warehouse is further adapted to control the steps.
  receiving a bin at a port of said automated Surface Mount Device (SMD) warehouse;
  storing said bin at a position within said automated Surface Mount Device (SMD) warehouse; or to control the steps
  retrieving said bin at a position within said automated Surface Mount Device (SMD) warehouse;
  presenting said retrieved bin at a port of said automated Surface Mount Device (SMD) warehouse;
  storing said position and said bin ID in a memory of said automated Surface Mount Device (SMD) warehouse.

An embodiment 21 including a method for determining tape reel identities of component tape reels comprised in a bin, wherein each slot or compartment of said bin is configured for carrying/holding a component tape reel;
  scanning an identity tag attached to a bin to obtain a unique bin ID;
    retrieving the identities (IDs) of a plurality of component tape reels comprised in said bin from an SMT information database, where the identities of the component tape reels comprised in said bin are retrieved by their association, in said SMT information database, to said unique bin ID.

An embodiment 22 including the method of embodiment 21, wherein component tape reel identities (IDs) are associated with respective bin ID in said SMT information database, and wherein the unique bin IDs are obtained by scanning the identity tags attached to the bins and the identities (IDs) of a plurality of component tape reels associated to a scanned bin ID are further obtained from said SMT information database using database lookup.

An embodiment 23 including the methods of any of the embodiments 21 and 22, wherein said scanning comprises optically scanning a code such as a bar code, QR code or the like, wherein the scanned bar code is presented on a printed label or an alphanumerical display attached to said bin.

An embodiment 24 including the methods of any of the embodiments 21 to 23, wherein the bar code, representing the unique bin ID of the bin, is presented as displayed information on an alphanumerical display attached to said bin, and wherein said displayed bar code on said alphanumerical display is provided to be scanned by a scanner in order to obtain SMT job related information.

The invention claimed is:

1. A method for storing bins at one or more particular positions within an automated Surface Mount Device (SMD) warehouse, the automated SMD warehouse including an actuator configured to automatically handle objects within the automated Surface Mount Device (SMD) warehouse, the method comprising:
  receiving a bin at a port of the automated SMD warehouse, the bin including a plurality of compartments, each compartment configured to hold a separate bin load unit, each bin load unit including a component tape reel;

scanning an identity tag attached to the bin to obtain a unique bin ID associated with the bin and to further determine a unique bin load unit ID associated with a unique identity of a bin load unit held in the bin, based on accessing an association between the unique bin ID and the bin load unit ID in Surface Mount Technology (SMT) information database;

storing the bin at a particular position within the automated SMD warehouse by the actuator; and storing data representing an association between the particular position within the automated SMD warehouse and the obtained unique bin ID, via a communications network, as parameters in the SMT information database based on both the scanning and the storing the bin at the particular position within the automated SMD warehouse, such that the bin load unit ID associated with the unique identity of the bin load unit held in the bin is associated, in the SMT information database, with the particular position within the automated SMD warehouse.

2. The method of claim 1, further comprising:
storing the data representing the particular position and the obtained unique bin ID in a memory of the automated SMD warehouse.

3. The method of claim 1, further comprising:
presenting a retrieved bin at a port of the automated SMD warehouse by the actuator.

4. The method of claim 1, wherein
the automated SMD warehouse is a first automated SMD warehouse of an integrated automated SMD warehouse cluster,
storing the bin at the particular position includes redistributing the bin, by the actuator, from the first automated SMD warehouse to a second automated SMD of the integrated automated SMD warehouse cluster.

5. The method of claim 1, wherein
the automated SMD warehouse is included in an integrated automated SMD warehouse cluster,
receiving the bin at the port of the automated SMD warehouse includes redistributing the bin from a second automated SMD warehouse of the integrated automated SMD warehouse cluster to the automated SMD warehouse.

6. The method of claim 1, wherein storing data representing the particular position and the obtained unique bin ID including storing information representing the particular position and the obtained unique bin ID as parameters of a database in a memory of the automated SMD warehouse.

7. The method of claim 1, wherein the identity tag includes an optically scanned code on a printed label or an alphanumerical display.

8. The method of claim 1, wherein
the automated SMD warehouse is a first automated SMD warehouse of an integrated automated warehouse cluster, the integrated automated SMD warehouse cluster further including a second automated SMD warehouse,
the method includes redistributing bin load units between the first automated SMD warehouse and the second automated SMD warehouse via a first opening in the first automated SMD warehouse and a second opening in the second automated SMD warehouse,
a first actuator in the first automated SMD warehouse is configured to grip a bin load unit in the second opening and a second actuator in the second automated SMD warehouse is configured to grip a bin load unit in the first opening, such that the redistributing redistributes the bin load units from the first automated SMD warehouse and the second automated SMD warehouse by the first actuator and the second actuator.

9. A method for retrieving a bin at one or more particular positions within an automated Surface Mount Device (SMD) warehouse, the automated SMD warehouse including an actuator configured to automatically handle objects within the automated Surface Mount Device (SMD) warehouse, the method comprising:

retrieving, by the actuator, the bin from a particular position within the automated Surface Mount Device (SMD) warehouse, the bin including a plurality of compartments, each compartment configured to hold a separate bin load unit, each bin load unit including a component tape reel, the retrieving based on
receiving input data associated with an upcoming SMT job, the input data including data identifying a particular component tape reel,
identifying a unique bin load unit ID associated with a unique identity of the bin load unit,
identifying a unique bin ID of a bin in which the bin load unit is held, and
identifying the particular position as a particular position within the automated SMD warehouse at which the bin is stored; and presenting, by the actuator, the retrieved bin at a port of the automated SMD warehouse.

10. The method of claim 9, further comprising:
storing the data representing the particular position and the obtained unique bin ID as parameters of a database in a memory of the automated SMD warehouse.

11. The method of claim 9, further comprising:
storing the data representing the particular position and the obtained unique bin ID as parameters of a database in an SMT information database via a communications network.

12. The method of claim 9, wherein
the automated SMD warehouse is a first automated SMD warehouse of an integrated automated warehouse cluster, the integrated automated SMD warehouse cluster further including a second automated SMD warehouse,
the method includes redistributing bin load units between the first automated SMD warehouse and the second automated SMD warehouse via a first opening in the first automated SMD warehouse and a second opening in the second automated SMD warehouse,
a first actuator in the first automated SMD warehouse is configured to grip a bin load unit in the second opening and a second actuator in the second automated SMD warehouse is configured to grip a bin load unit in the first opening, such that the redistributing redistributes the bin load units from the first automated SMD warehouse and the second automated SMD warehouse by the first actuator and the second actuator.

13. A bin for use in a Surface Mount Technology (SMT) system, the bin configured to be loaded with one or more bin load units, the bin comprising:

a plurality of compartments, each compartment configured to hold a separate bin load unit, each separate bin load unit including a component tape reel; and
an identity tag attached to the bin in a particular position, the identity tag of the bin being a unique bin ID that is associated, in an SMT information database, with each separate unique bin load unit ID associated with each separate unique identity of each bin load unit held in the plurality of compartments, such that each separate bin load unit ID associated with the unique bin ID in the SMT information database, such that the identity tag is configured to enable retrieval of the separate unique identity of each bin load unit held in the bin from the SMT information database based on the identity tag being scanned.

14. The bin of claim 13, wherein the identity tag is attached to the bin in the particular position such that the bin is configured to enable a bar code scanner in a Surface Mount Device (SMD) warehouse to automatically scan the identity tag at a port of said SMD warehouse.

15. An automated Surface Mount Device (SMD) warehouse for storing or retrieving bins, the automated SMD warehouse comprising:
    an actuator configured to scan an identity tag attached to a bin to obtain a unique bin ID associated with the bin and retrieve or store bins at one or more particular positions within the automated SMD warehouse, the bin including a plurality of compartments, each compartment configured to hold a separate bin load unit, each separate bin load unit including a component tape reel;
    a memory storing a computer readable code; and
    a processor configured to execute the computer readable code to
        associate the unique bin ID of a bin with each separate unique bin load unit ID associated with each separate unique identity of each bin load unit held in a plurality of compartments of the bin,
        control the actuator to scan an identity tag of the bin to obtain the unique bin ID of the bin and to further obtain each separate unique bin load unit ID of each bin load unit held in the bin,
        control the actuator to store the bin at a particular position within the automated SMD warehouse, and
        store data representing an association between the particular position and the obtained unique bin ID, via a communications network, as parameters in an SMT information database based on scanning the identity tag and storing the bin at the particular position, such that each bin load unit ID of each bin load unit held in the bin is associated, in the SMT information database, with the particular position within the automated SMD warehouse.

16. The automated SMD warehouse of claim 15, wherein the processor is further configured to execute the computer readable code to
    control the actuator to retrieve the bin at the particular position;
    control the actuator to present the retrieved bin at a port of the automated SMD warehouse; and
    store the data representing the particular position and the obtained unique bin ID in a memory of the automated SMD warehouse.

* * * * *